United States Patent
Chou et al.

(10) Patent No.: US 12,199,156 B2
(45) Date of Patent: Jan. 14, 2025

(54) CONTACT FORMATION WITH REDUCED DOPANT LOSS AND INCREASED DIMENSIONS

(71) Applicant: Taiwan Semiconductor Manufacturing Co., Ltd., Hsinchu (TW)

(72) Inventors: Meng-Han Chou, Hsinchu (TW); Yi-Syuan Siao, Changhua (TW); Su-Hao Liu, Jhongpu Township (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 339 days.

(21) Appl. No.: 17/650,329

(22) Filed: Feb. 8, 2022

(65) Prior Publication Data

US 2023/0034803 A1    Feb. 2, 2023

Related U.S. Application Data

(60) Provisional application No. 63/226,834, filed on Jul. 29, 2021.

(51) Int. Cl.
*H01L 29/417* (2006.01)
*H01L 21/8238* (2006.01)
(Continued)

(52) U.S. Cl.
CPC ............ *H01L 29/41791* (2013.01); *H01L 21/823814* (2013.01); *H01L 21/823821* (2013.01);
(Continued)

(58) Field of Classification Search
CPC ....... H01L 29/41791; H01L 21/823814; H01L 21/823821; H01L 21/823871;
(Continued)

(56) References Cited

U.S. PATENT DOCUMENTS

| 9,852,947 | B1 | 12/2017 | Ko et al. |
| 11,276,766 | B2 | 3/2022 | Tsai et al. |
| 11,348,792 | B2 | 5/2022 | Liu et al. |
| 2002/0164847 | A1 | 11/2002 | Kim et al. |

(Continued)

FOREIGN PATENT DOCUMENTS

| KR | 20020085067 A | 11/2002 |
| KR | 20160097869 A | 8/2016 |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A method includes forming a source/drain region, forming a dielectric layer over the source/drain region, and etching the dielectric layer to form a contact opening. The source/drain region is exposed to the contact opening. The method further includes depositing a dielectric spacer layer extending into the contact opening, etching the dielectric spacer layer to form a contact spacer in the contact opening, implanting a dopant into the source/drain region through the contact opening after the dielectric spacer layer is deposited, and forming a contact plug to fill the contact opening.

20 Claims, 21 Drawing Sheets

(51) Int. Cl.
*H01L 27/092* (2006.01)
*H01L 29/40* (2006.01)
*H01L 29/66* (2006.01)
*H01L 29/78* (2006.01)

(52) U.S. Cl.
CPC .. *H01L 21/823871* (2013.01); *H01L 27/0924* (2013.01); *H01L 29/401* (2013.01); *H01L 29/41775* (2013.01); *H01L 29/66795* (2013.01); *H01L 29/7851* (2013.01)

(58) Field of Classification Search
CPC ............... H01L 27/0924; H01L 29/401; H01L 29/41775; H01L 29/66795; H01L 29/7851; H01L 27/092; H01L 29/0847; H01L 29/785; H01L 21/823475; H01L 21/266; H01L 21/823418; H01L 21/823431; H01L 27/0886
See application file for complete search history.

(56) References Cited

U.S. PATENT DOCUMENTS

| | | |
|---|---|---|
| 2016/0233164 A1 | 8/2016 | Choi et al. |
| 2016/0336412 A1 | 11/2016 | Hung et al. |
| 2016/0359008 A1 | 12/2016 | Choi et al. |
| 2018/0047623 A1 | 2/2018 | Xie |
| 2019/0067130 A1 | 2/2019 | Koh et al. |
| 2019/0279992 A1* | 9/2019 | Yu .................... H01L 29/66545 |
| 2019/0333820 A1* | 10/2019 | Chang ............... H01L 21/76843 |
| 2020/0219997 A1 | 7/2020 | Mehandru et al. |
| 2021/0043502 A1 | 2/2021 | Wu |

FOREIGN PATENT DOCUMENTS

| | | |
|---|---|---|
| KR | 20160144542 A | 12/2016 |
| KR | 20190022253 A | 3/2019 |
| TW | 202002019 A | 1/2020 |
| TW | 202036786 A | 10/2020 |

* cited by examiner

US 12,199,156 B2

CONTACT FORMATION WITH REDUCED DOPANT LOSS AND INCREASED DIMENSIONS

PRIORITY CLAIM AND CROSS-REFERENCE

This application claims the benefit of the following provisionally filed U.S. Patent application: Application No. 63/226,834, filed on Jul. 29, 2021, and entitled "MD Implant Sequence Change for Dopant Loss Prevention and MD_CD Enlargement," which application is hereby incorporated herein by reference.

BACKGROUND

With the sizes of integrated circuits becoming increasingly smaller, the respective formation processes also become increasingly more difficult, and problems may occur where conventionally no problems have occurred. For example, in the formation of Fin Field-Effect Transistors (FinFETs), the sizes of source/drain regions become increasingly smaller, making contact resistance increasingly higher.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
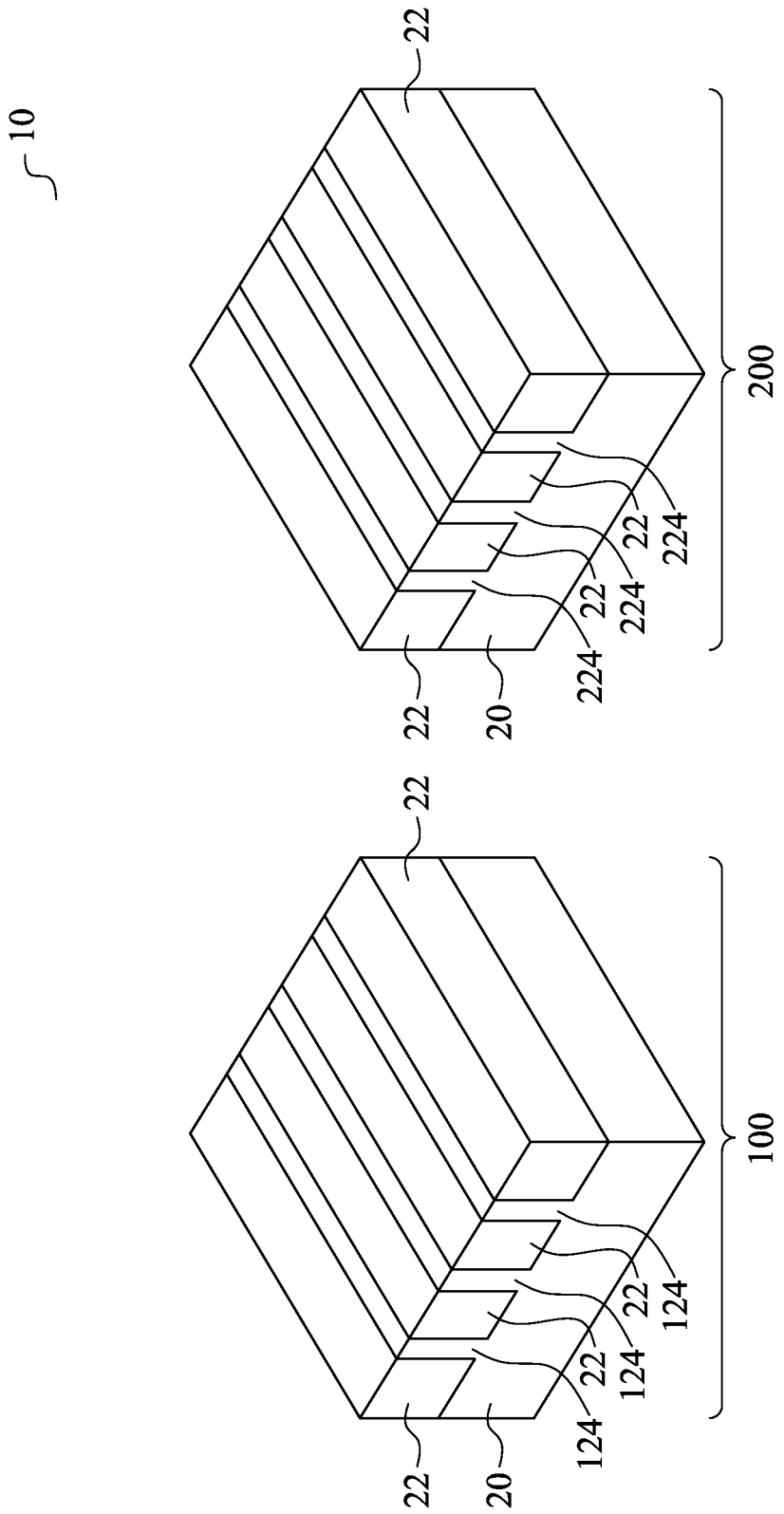
FIGS. 1-6, 7A, 7B, 8A, 8B, and 9-15 illustrate the cross-sectional views and perspective views of intermediate stages in the formation of Fin Field-Effect Transistors (FinFETs) and contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Contact plugs for transistors and the methods of forming the same are provided in accordance with various embodiments. In accordance with some embodiments, a transistor is formed. A contact opening is then formed to reveal a source/drain region of the transistor. A conformal dielectric spacer layer is then formed, and extends into the contact opening, and is then etched to form a contact spacer. An implantation process is then performed to implant a dopant into the source/drain region and the contact spacer. A silicide region and a contact plug are then formed in the contact opening. By performing the implantation process after the formation of the contact spacer, the lateral dimension of the contact plug is not substantially reduced due to the implantation. Furthermore, the dopant loss in the source/drain region is reduced. The intermediate stages of forming the transistors are illustrated in accordance with some embodiments. In some illustrated embodiments, the formation of Fin Field-Effect Transistors (FinFETs) is used as an example to explain the concept of the present disclosure. Other transistors such as planar transistors, Gate-All-Around (GAA) transistors, etc., may also adopt the concept of the present disclosure. Some variations of some embodiments are discussed. Throughout the various views and illustrative embodiments, like reference numbers are used to designate like elements.

FIGS. 1-6, 7A, 7B, 8A, 8B, and 9-15 illustrate the cross-sectional views and perspective views of intermediate stages in the formation of transistors (which may be FinFETs, for example) in accordance with some embodiments of the present disclosure. The processes are also reflected schematically in the process flow 300 shown in FIG. 19.

FIG. 1 illustrates a perspective view of an initial structure. The initial structure includes wafer 10, which further includes substrate 20. Wafer 10 includes device region 100 and device region 200, each for forming a transistor. In accordance with some embodiments of the present disclosure, the transistors formed in device regions 100 and 200 are of opposite types. For example, the transistor formed in device region 100 may be a p-type transistor, and the transistor formed in device region 200 may be an n-type transistor. In accordance with other embodiments, the transistor formed in device region 100 may be an n-type transistor, and the transistor formed in device region 200 may be a p-type transistor. In accordance with yet other embodiments, the transistors formed in device regions 100 and 200 are of the same conductivity type such as p-type or n-type.

Substrate 20 may be a semiconductor substrate, which may be a silicon substrate, a silicon germanium substrate, or a substrate formed of other semiconductor materials. In accordance with some embodiments, substrate 20 includes a bulk silicon substrate and an epitaxy silicon germanium (SiGe) layer or a germanium layer (without silicon therein) over the bulk silicon substrate. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
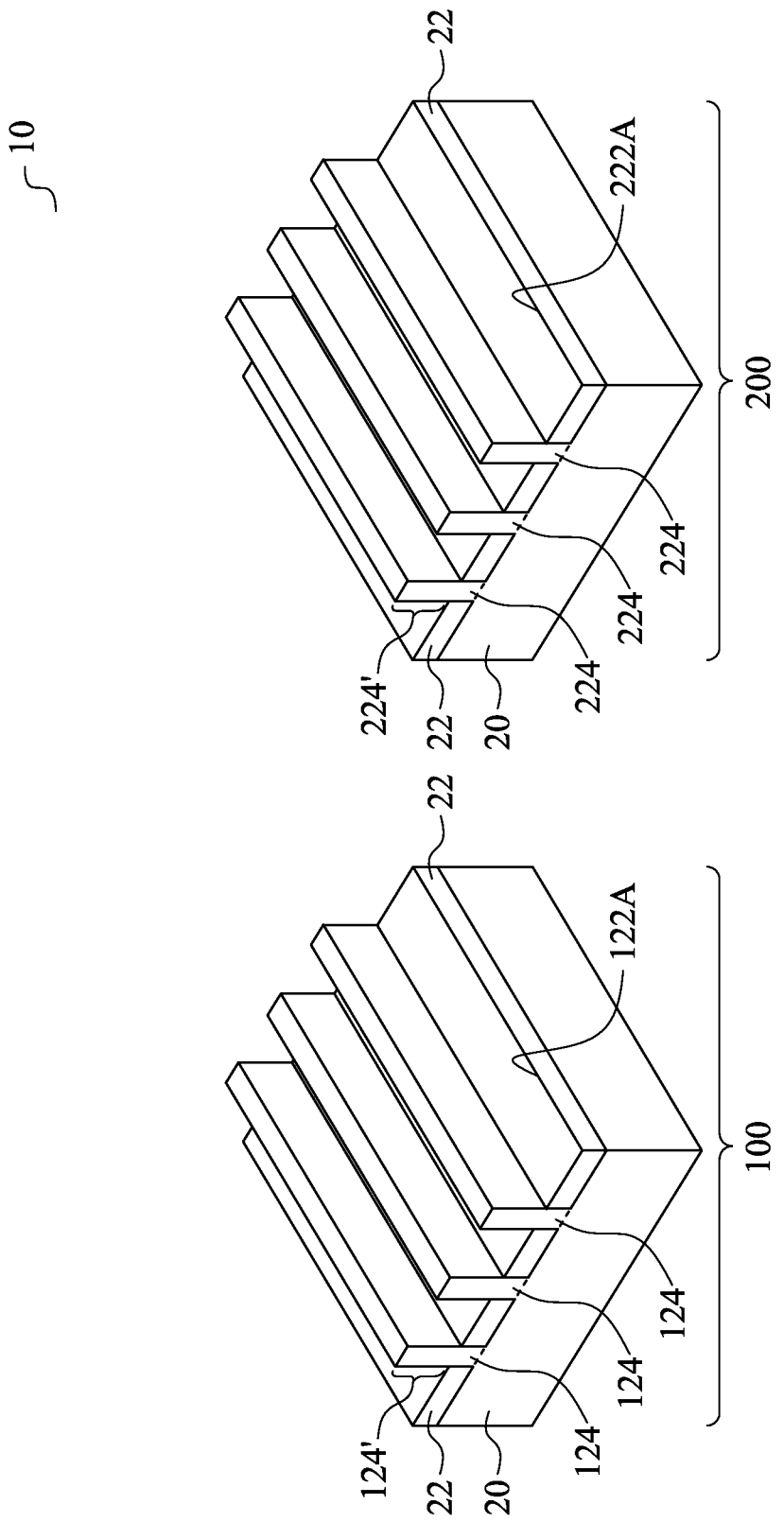
Figure 19:
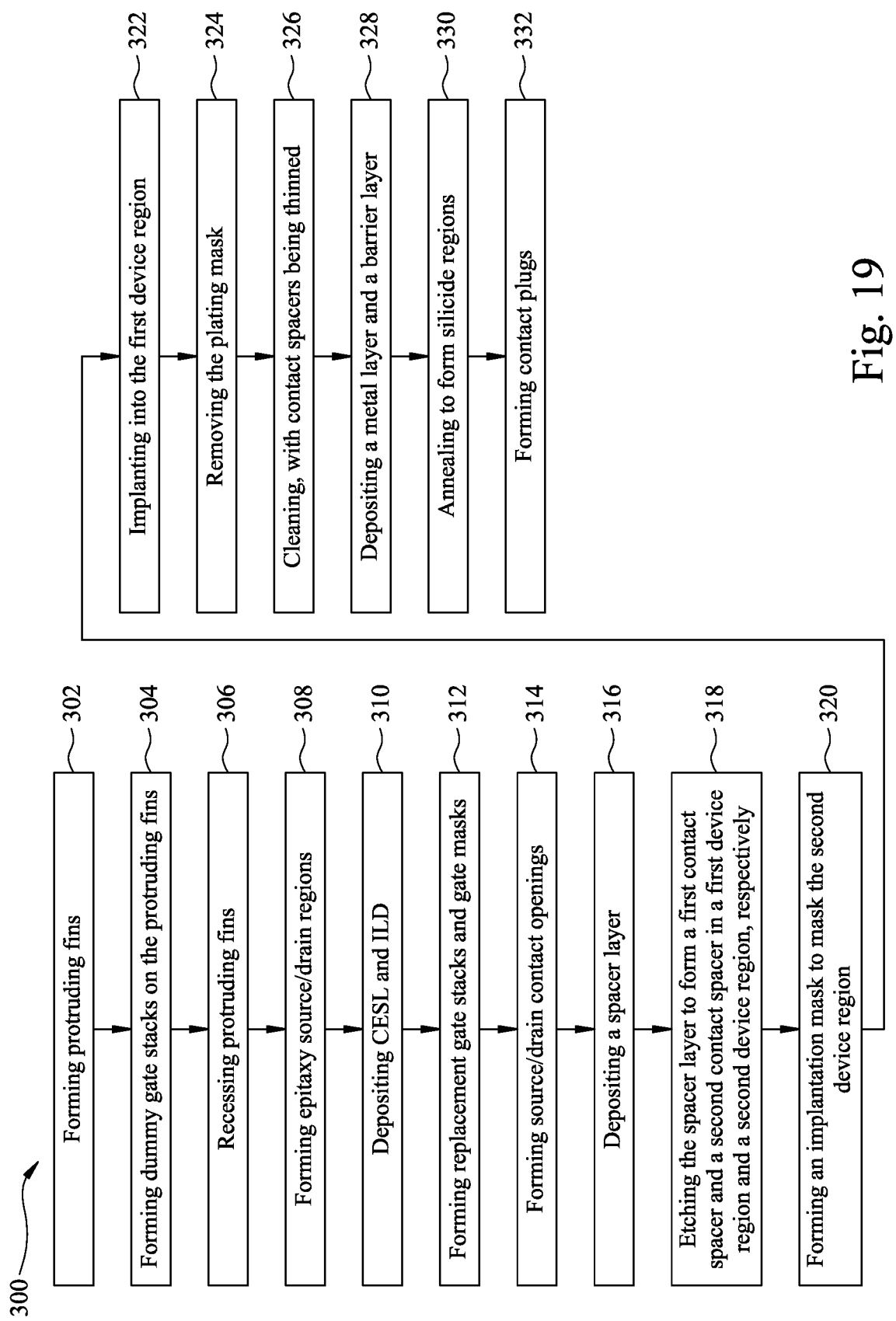
FIG. 19 illustrates a process flow for forming FinFETs in accordance with some embodiments.

Referring to FIG. 2, STI regions 22 are recessed, so that the top portions of semiconductor strips 124 and 224 protrude higher than the top surfaces 122A and 222A of the neighboring STI regions 22 to form protruding fins 124' and 224', respectively. The respective process is illustrated as process 302 in the process flow 300 as shown in FIG. 19. The etching may be performed using a dry etching process, which may be performed using $NH_3$ and $NF_3$, for example, as the etching gases. During the etching process, plasma may be generated for the etching. Argon may also be included. In accordance with alternative embodiments of the present disclosure, the recessing of STI regions 22 is performed using a wet etching process. The etching chemical may include diluted HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
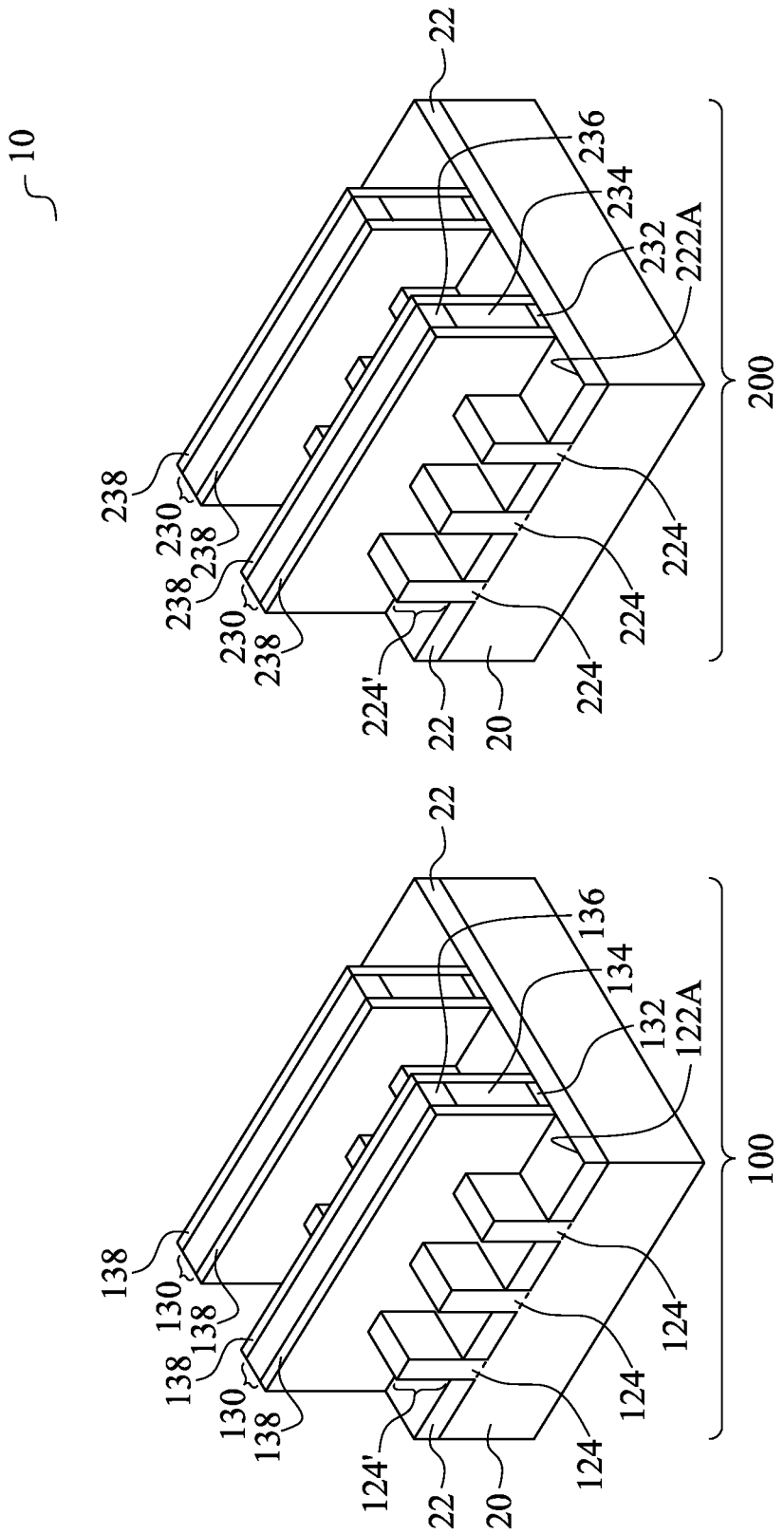

Referring to FIG. 3, dummy gate stacks 130 and 230 are formed on the top surfaces and the sidewalls of protruding fins 124' and 224', respectively. The respective process is illustrated as process 304 in the process flow 300 as shown in FIG. 19. Dummy gate stacks 130 may include dummy gate dielectrics 132 and dummy gate electrodes 134 over dummy gate dielectrics 132. Dummy gate stacks 230 may include dummy gate dielectrics 232 and dummy gate electrodes 234 over dummy gate dielectrics 232. Dummy gate dielectrics 132 and 232 may be formed through thermal oxidation, chemical oxidation, or a deposition process, and may be formed of or comprise, for example, silicon oxide. FIG. 3 illustrates the deposited gate dielectrics 132 and 232, which includes horizontal portions extending on STI regions 22. Otherwise, when dummy gate dielectrics 132 and 232 are formed through oxidation, dummy gate dielectrics 132 and 232 are formed on the surfaces of protruding fins 124' and 224', and do not include horizontal portions on STI regions 22.

Dummy gate electrodes 134 and 234 may be formed, for example, using amorphous silicon or polysilicon, and other materials such as amorphous carbon may also be used. Dummy gate stacks 130 and 230 may also include hard mask layers 136 and 236, respectively. Hard mask layers 136 and 236 may be formed of silicon nitride, silicon carbo-nitride, or the like, or multi-layers thereof. Each of dummy gate stacks 130 and 230 crosses over a single one or a plurality of protruding fins 124' and 224', respectively.

Next, gate spacers 138 and 238 are formed on the sidewalls of dummy gate stacks 130 and 230, respectively. In the meantime, fin spacers (not shown) may also be formed on the sidewalls of protruding fins 124' and 224'. In accordance with some embodiments of the present disclosure, gate spacers 138 and 238 are formed of or comprise a dielectric material(s) such as silicon oxynitride (SiON), silicon oxy-carbo-nitride (SiOCN), silicon nitride, or the like, and may have a single-layer structure or a multi-layer structure including a plurality of dielectric layers. For example, gate spacers 138 and 238 may include a low-k dielectric sub-layer and a non-low-k dielectric sub-layer. The formation of gate spacers 138 and 238 may include one or a plurality of conformal deposition processes, followed by one or a plurality of anisotropic etching processes. The conformal deposition processes may be performed using ALD, CVD, or the like.

Figure 4:
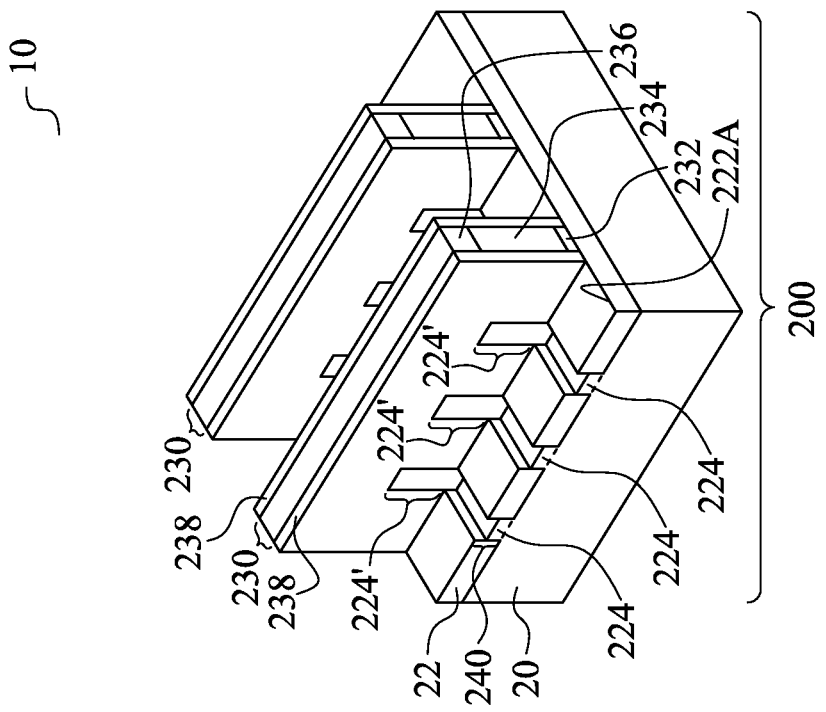
Figure 4:
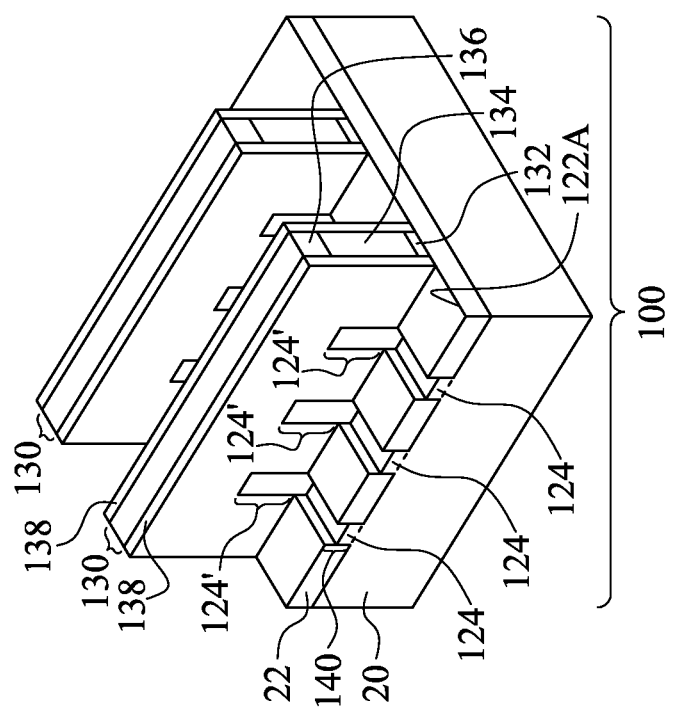

An etching process is then performed to etch the portions of protruding fins 124' and 224' that are not covered by the corresponding dummy gate stacks 130 and 230 and gate spacers 138 and 238, resulting in the structure shown in FIG. 4. The respective process is illustrated as process 306 in the process flow 300 as shown in FIG. 19. The etching process may be anisotropic, and hence the portions of fins 124' and 224' directly underlying the respective dummy gate stack 130/230 and gate spacers 138/238 are protected, and are not etched. The top surfaces of the recessed semiconductor strips 124 and 224 may be lower than the top surfaces of the adjacent STI regions 22 in accordance with some embodiments. Recesses 140 and 240 are accordingly formed between STI regions 22. The recessing in device regions 100 and 200 may be performed in a common etching process or in separate processes, and the depths of recesses 140 may be equal to or different from the depths of recesses 240.

Figure 5:
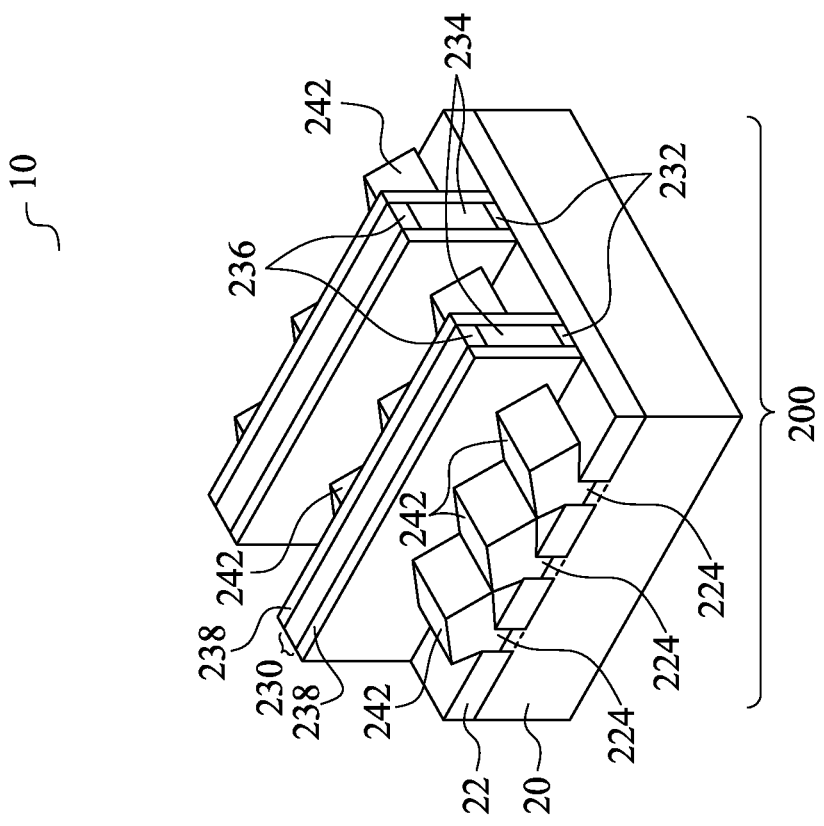
Figure 5:
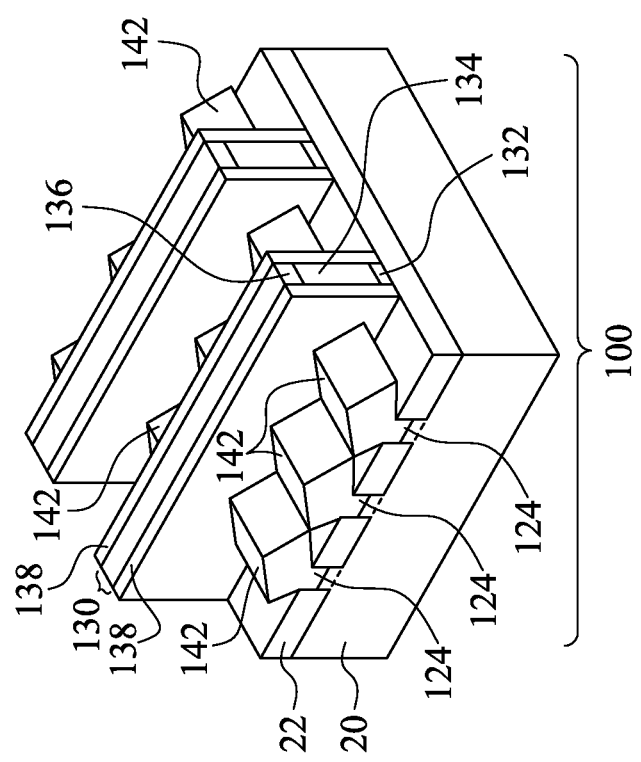

Next, epitaxy regions (source/drain regions) are formed by selectively growing a semiconductor material(s) from recesses 140 and 240, resulting in the structure in FIG. 5. The respective process is illustrated as process 308 in the process flow 300 as shown in FIG. 19. The material of epitaxy regions is related to whether the corresponding device region is for forming a p-type transistor or an n-type transistor. In accordance with some embodiments when the respective transistor is a p-type transistor, the corresponding epitaxy regions 142 or 242 may include silicon germanium doped with boron (SiGeB), silicon boron (SiB), or the like, or multi-layers thereof, which are of p-type. In accordance with some embodiments when the respective transistor is an n-type transistor, the corresponding epitaxy regions 142 or 242 may be formed of or comprise silicon phosphorous (SiP), silicon carbon phosphorous (SiCP), silicon arsenic (SiAs), or the like, or multi-layers thereof, which are of n-type. When epitaxy regions 142 and 242 are of opposite conductivity types, the formation of epitaxy regions 142 and 242 are performed in separate processes and using different masks (not shown).

After recesses 140 and 240 are filled with the epitaxy semiconductor material, the further epitaxial growth of epitaxy regions 142 and 242 causes epitaxy regions 142 and 242 to expand horizontally, and facets may be formed. The epitaxy regions grown from neighboring recesses may be merged to form a large epitaxy region, or may stay as discrete epitaxy regions when they are not merged. Epitaxy regions 142 and 242 form the source/drain regions of the respective transistors, and may also be referred to as source/drain regions 142 and 242, respectively.

Figure 6:
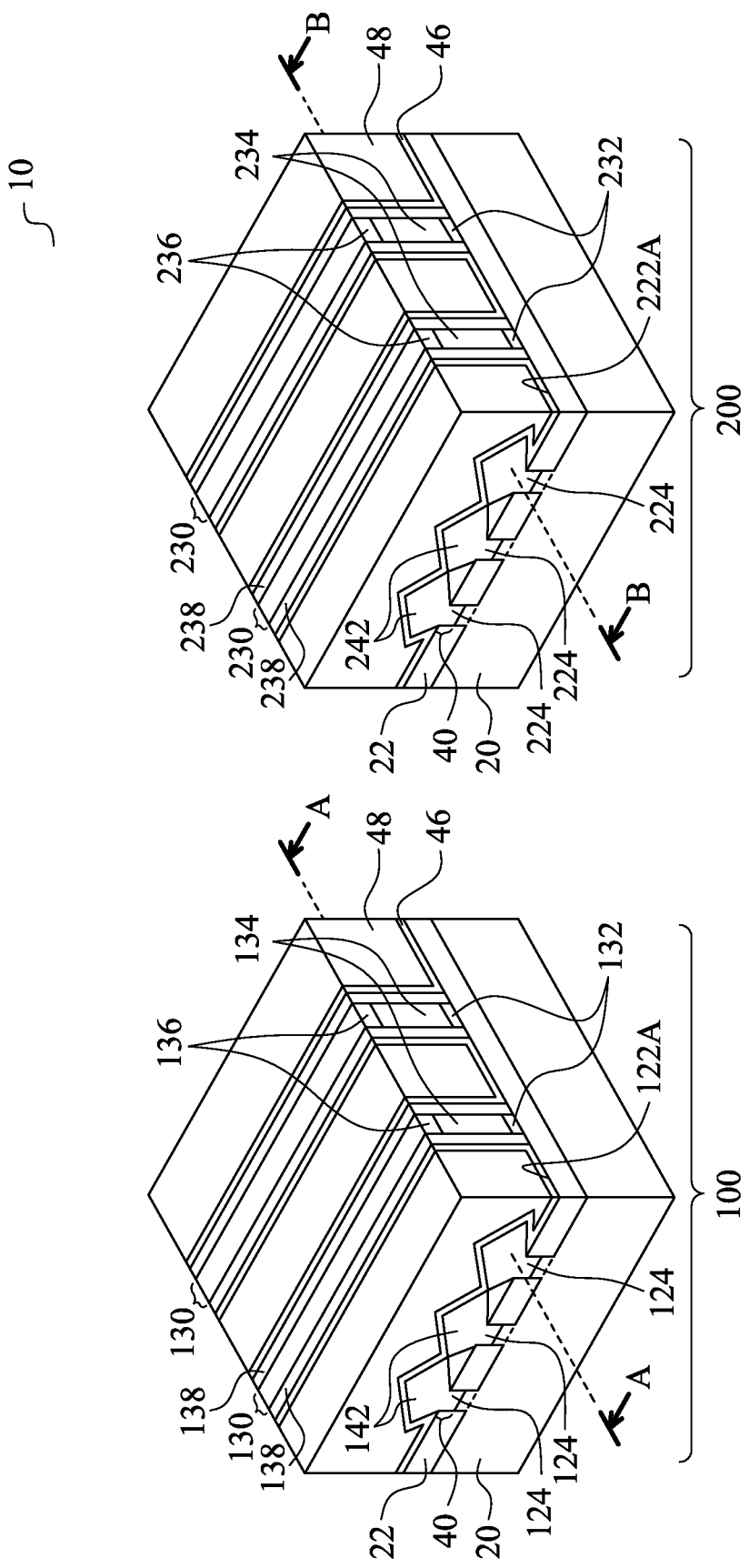

FIG. 6 illustrates a perspective view for depositing Contact Etch Stop Layer (CESL) 46 and Inter-Layer Dielectric (ILD) 48. The respective process is illustrated as process 310 in the process flow 300 as shown in FIG. 19. In accordance with some embodiments of the present disclosure, CESL 46 is formed of silicon nitride, silicon carbo-nitride, or the like. CESL 46 may be formed through a conformal deposition process such as ALD or CVD, for example. ILD 48 is formed over CESL 46, and may be formed using, for example, FCVD, spin-on coating, CVD, or the like. ILD 48 may be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A planarization process such as a Chemical Mechanical Polish (CMP) process or a mechanical grinding process may be performed to level the top surfaces of CESL 46, ILD 48, dummy gate stacks 130 and 230, and gate spacers 138 and 238 with each other.

After the structure shown in FIG. 6 is formed, the dummy gate stacks 130 and 230 including hard mask layers 136 and 236, dummy gate electrodes 134 and 234, and dummy gate dielectrics 132 and 232 are replaced with metal gates and replacement gate dielectrics, which form replacement gate stacks. The respective process is illustrated as process 312 in the process flow 300 as shown in FIG. 19. To form the replacement gates, the replacement gate stacks 130 and 230 as shown in FIG. 6 are removed through etching processes, forming trenches between gate spacers 138 and between gate spacers 238, respectively. The top surfaces and the sidewalls of protruding fins 124' and 224' are thus exposed to the resulting trenches.

Figure 7A:
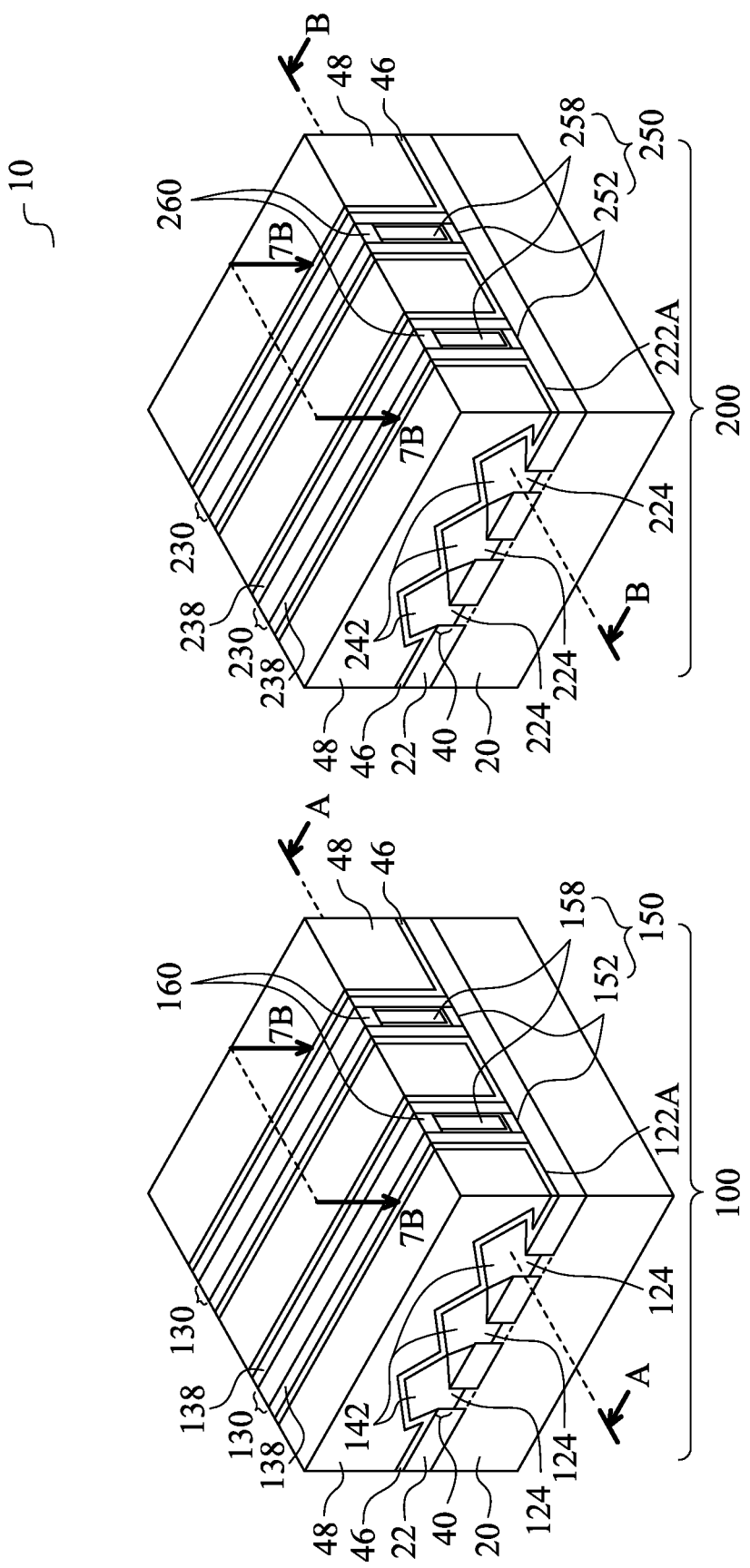
Figure 7B:
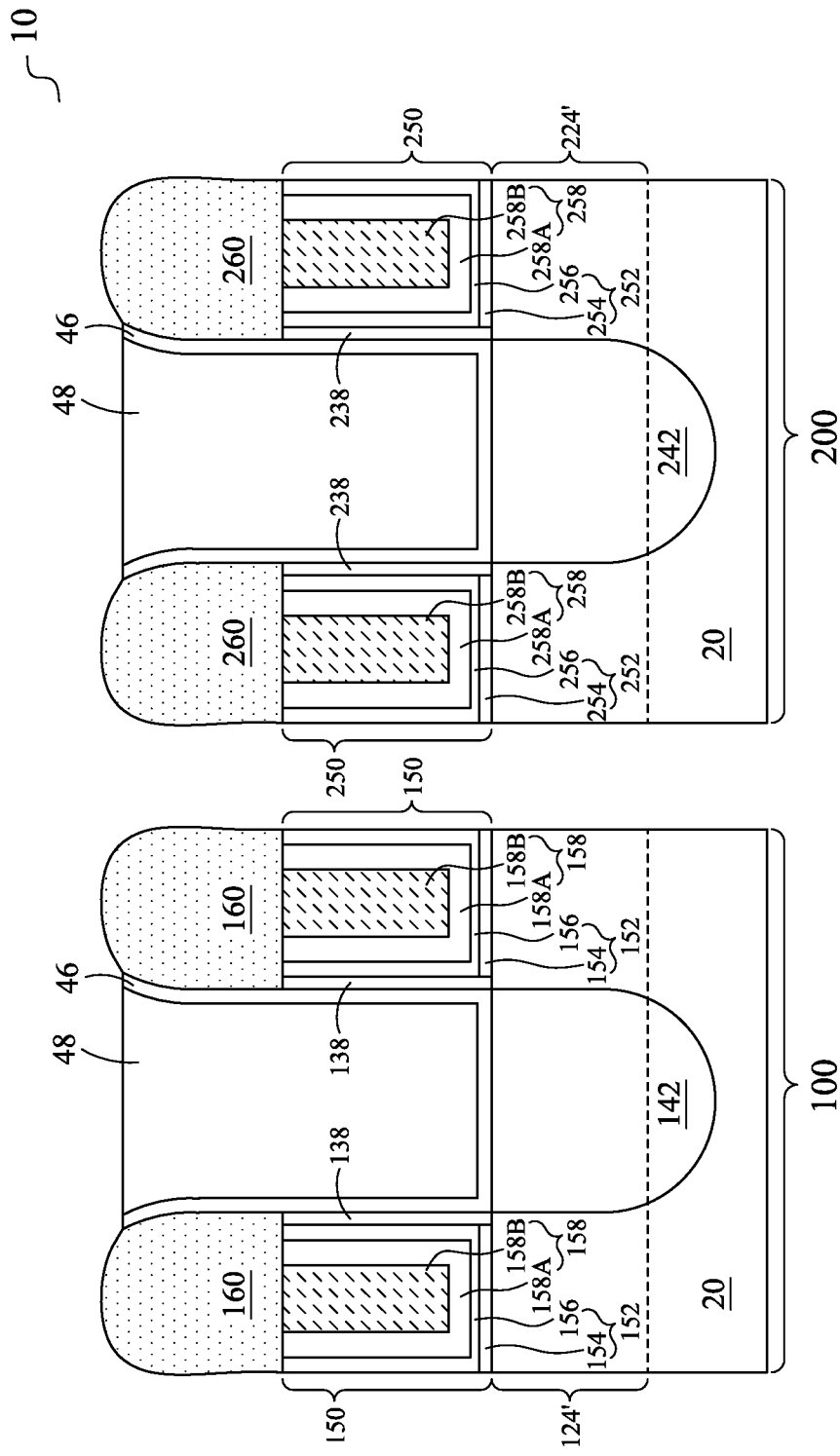

Replacement gate stacks 150 and 250 are then formed in the trenches, as shown in FIGS. 7A and 7B, which illustrate a perspective view and a cross-sectional view of portions of wafer 10. In accordance with some embodiments of the present disclosure, replacement gate stacks 150 include gate dielectrics 152 and gate electrodes 158 over the corresponding gate dielectrics 152. Replacement gate stacks 250 include gate dielectrics 252 and gate electrodes 258 over the corresponding gate dielectrics 252. Gate dielectrics 152 and 252 include Interfacial Layers (ILs) 154 and 254 and the overlying high-k dielectric layers 156 and 256, respectively, as shown in FIG. 7B. ILs 154 and 254 are formed on the exposed surfaces of protruding fins 124' and 224', respectively. Each of ILs 154 and 254 may include an oxide layer such as a silicon oxide layer, which is formed through the thermal oxidation of the surface layers of protruding fins 124' and 224', a chemical oxidation process, or a deposition process.

Gate electrodes 158 and 258 (FIG. 7B) may include a plurality of stacked conductive sub-layers. The formation of gate electrodes 158 and 258 may include conformal deposition processes such as ALD or CVD, so that the thicknesses of the vertical portions and the thickness of the horizontal portions of the stacked conductive sub-layers are substantially equal to each other.

FIG. 7B illustrates the cross-sections 7B-7B as shown in FIG. 7A. As shown in FIG. 7B, gate dielectrics 152 and 252 may further include high-k dielectric layers 156 and 256 formed over ILs 154 and 254, respectively. High-k dielectric layers 156 and 256 may be formed of or comprise a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layers 156 and 256 are formed as conformal layers, and extend on the sidewalls of protruding fins 124' and 224' and the sidewalls of gate spacers 138 and 238. In accordance with some embodiments of the present disclosure, high-k dielectric layers 156 and 256 are formed using ALD or CVD.

It is appreciated that although FIG. 7B illustrates that top surfaces of epitaxy regions 142 and 242 as being coplanar as the top surfaces of protruding fins 124' and 224', the top surfaces of epitaxy regions 142 and 242 may be higher than the top surfaces of the corresponding protruding fins 124' and 224'.

Gate electrodes 158 and 258 (FIG. 7B) may include a plurality of stacked conductive sub-layers. The formation of gate electrodes 158 and 258 may include conformal deposition processes such as ALD or CVD, so that the thicknesses of the vertical portions and the thickness of the horizontal portions of the stacked conductive sub-layers are substantially equal to each other.

Gate electrodes 158 and 258 may include metal layer 158A and 258A, respectively, each including a diffusion barrier layer and one (or more) work-function layer (not shown separately) over the diffusion barrier layer. The diffusion barrier layer may be formed of titanium nitride (TiN), which may (or may not) be doped with silicon. The work-function layer determines the work function of the corresponding gate, and includes at least one layer, or a plurality of layers formed of different materials. The material of the work-function layer is selected according to whether the respective FinFET is an n-type FinFET or a p-type FinFET. For example, when device region 100 is a p-type device region, the work-function layer in metal layer 158A may include a TiN layer. When the device region 200 is an n-type device region, the corresponding work-function layer in metal layer 258A may include an aluminum-containing metal layer (such as TiAl, TiAlC, TiAlN, or the like). After the deposition of the work-function layer(s), a barrier layer, which may be another TiN layer, is formed.

Gate electrodes 158 and 258 may also include respective filling metals 158B and 258B filling the remaining trenches, if the trenches have not been fully filled by the respective metal layer 158A and 258A. The filling metal may be formed of tungsten or cobalt, for example. After the formation of the filling material, a planarization process such as a CMP process or a mechanical grinding process is performed, so that the portions of the deposited layers over ILD 48 are removed. The remaining portion of gate dielectrics 152/252 and gate electrodes 158/258 in combination are referred to as replacement gate stacks 150 and 250 hereinafter.

Self-aligned gate masks 160 and 260 are then formed in accordance with some embodiments. The respective process is also illustrated as process 312 in the process flow 300 as shown in FIG. 19. The self-aligned gate masks 160 and 260 are self-aligned to the underlying replacement gate stacks 150 and 250, and are formed of a dielectric material(s) such as $ZrO_2$, $Al_2O_3$, SiON, SiCN, $SiO_2$, or the like. The formation process may include recessing replacement gate stacks 150 and 250 through etching to form recesses, filling the dielectric material into the recesses, and performing a planarization process to remove excess portions of the dielectric material. The top surfaces of gate masks 160 and 260, gate spacers 138 and 238, CESL 46, and ILD 48 may be substantially coplanar at this time.

Figure 8A:
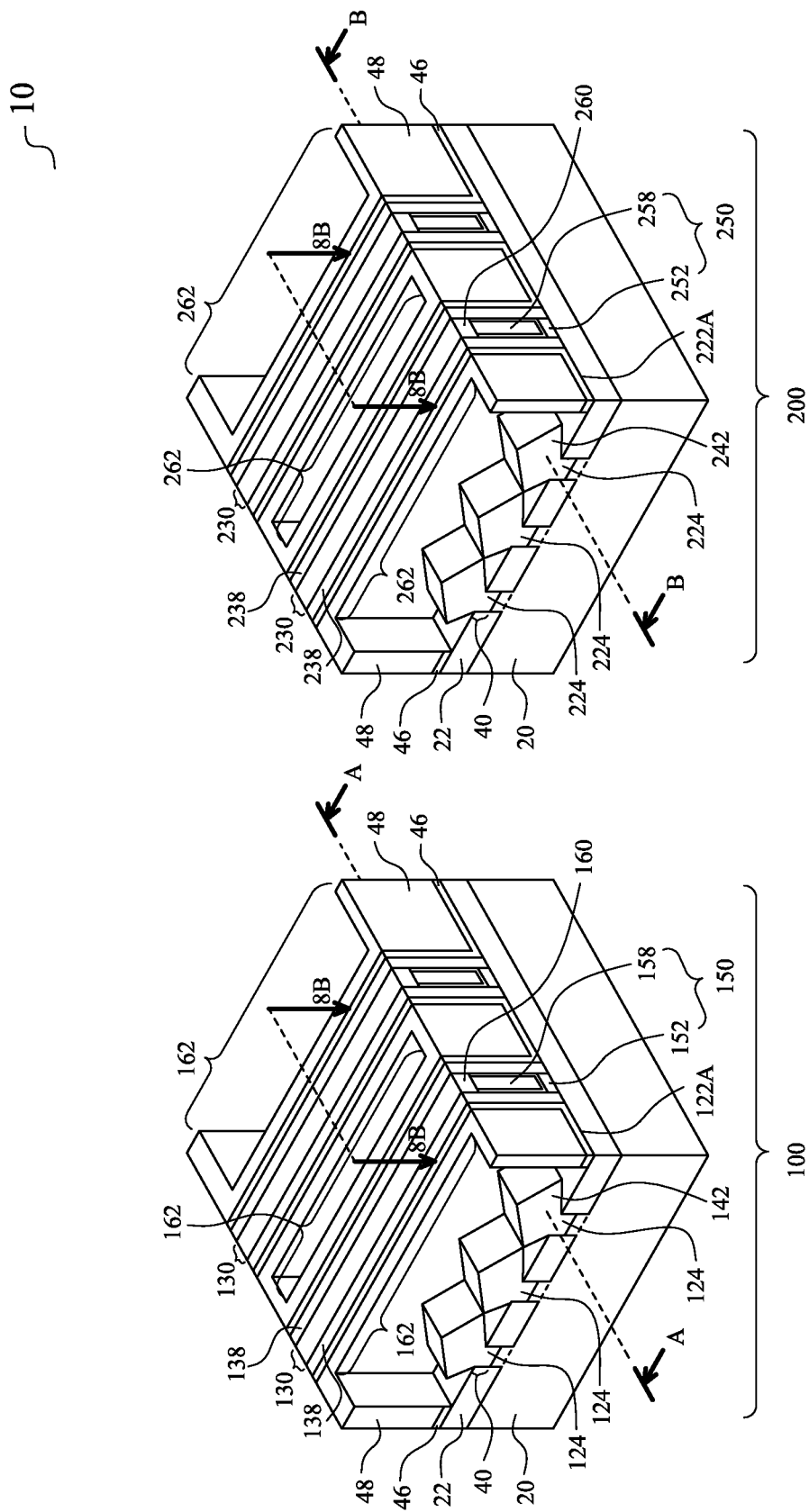
Figure 8B:
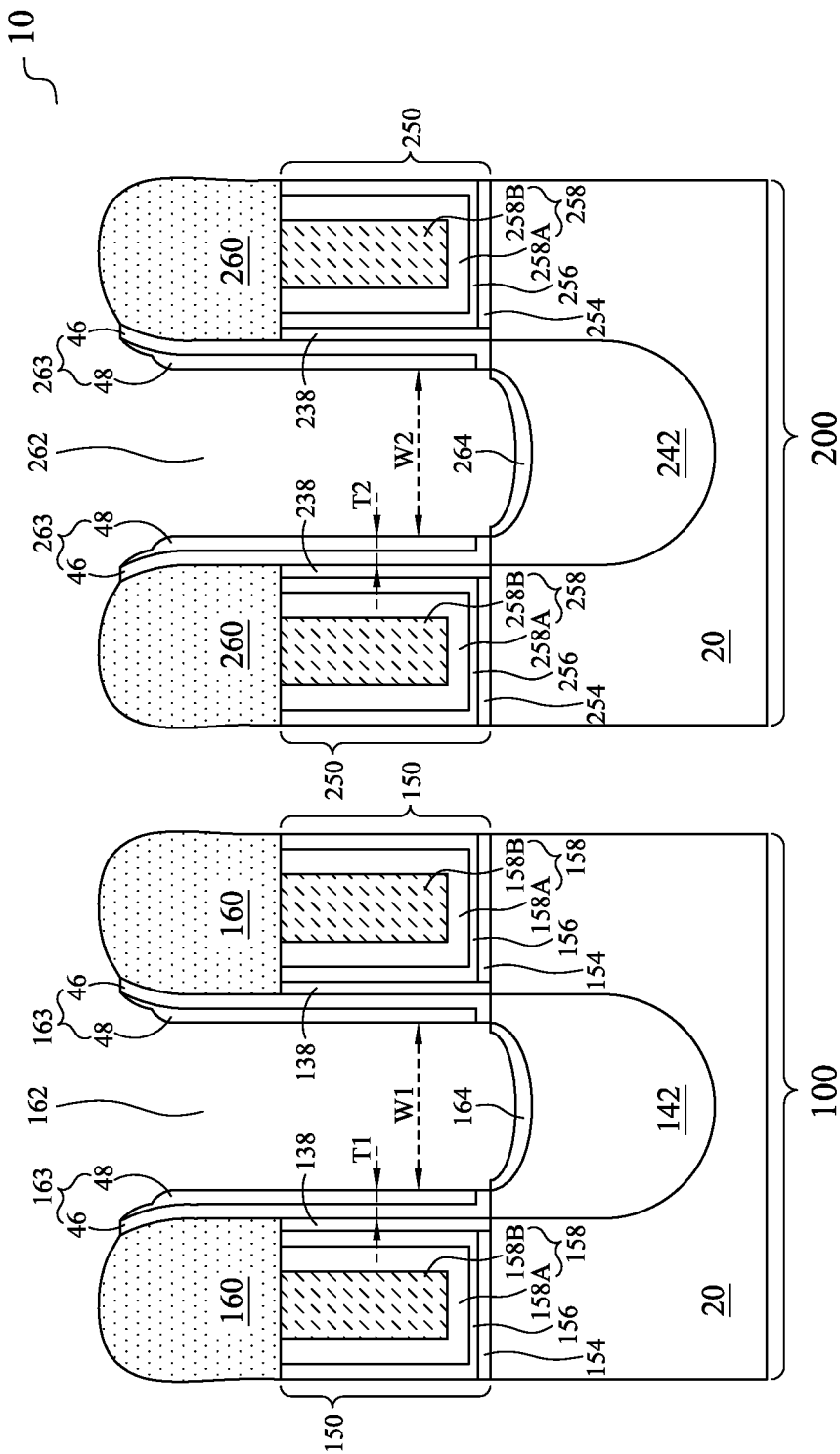

Referring to FIGS. 8A and 8B, ILD 48 and CESL 46 are etched to form source/drain contact openings 162 and 262. The respective process is illustrated as process 314 in the process flow 300 as shown in FIG. 19. FIG. 8B illustrates the cross-section 8B-8B as shown in FIG. 8A. CESL 46 is used as an etch stop layer in the etching of ILD 48, and then CESL 46 is etched, exposing the underlying source/drain regions 142 and 242. Contact openings 162 and 262 may be formed simultaneously, or may be formed separately. Due to the over-etching, openings 162 and 262 may extend slightly into source/drain regions 142 and 242, as shown in FIG. 8B.

Referring to FIG. 8B, after the formation of contact openings 162 and 262, there are some portions of CESL 46 and ILD 48 left on one side or both side of the respective contact openings 162 and 262 in accordance with some embodiments. The corresponding remaining portions of CESL 46 and ILD 48 are also used as parts of the spacers in the subsequent dopant implantation and silicidation processes. Accordingly, the remaining portions of CESL 46 and ILD 48 on the opposite sides of contact openings 162 and 262 are referred to as spacers 163 and 263. In accordance with alternative embodiments, the portions of CESL 46 and ILD 48 between neighboring gate spacers 138 and between neighboring gate spacers 238 are fully removed. As a result, the sidewalls of gate spacers 138 and 238 are exposed to the corresponding contact openings 162 and 262, respectively.

The exposed surfaces of source/drain regions 142 and 242 may be oxidized, for example, due to the exposure to open air or other oxygen-containing gas and/or moisture containing gas. The oxidation may also be caused due to a cleaning process performed after the formation of contact openings 162 and 262, in which the cleaning solution may include water. The oxidation results in oxide layers 164 and 264 to be formed on the exposed surfaces of source/drain regions 142 and 242, respectively. Oxide layers 164 and 264 may include silicon oxide, silicon germanium oxide, or the like, depending on the material of the underlying source/drain regions 142 and 242. In accordance with some embodiments, oxide layers 164 and 264 have thicknesses in a range between about 2 nm and about 4 nm.

In accordance with some embodiments, contact openings 162 and 262 have same lateral dimensions such as the same lengths, widths, diameters, etc. For example, the width W1 of contact opening 162 may be equal to the width W2 of contact opening 262. The widths W1 and W2 may be measured at the middle heights of gate stacks 150 and 250, respectively. Also, contact opening 162 may be formed in the middle between neighboring gate spacers 138, and contact opening 262 may be formed in the middle between neighboring gate spacers 238. Accordingly, the thickness T1 of spacer 163 may be equal to thickness T2 of spacer 263, wherein thicknesses T1 and T2 are also measured at the middle heights of the corresponding gate stacks 150 and 250, respectively.

Figure 9:
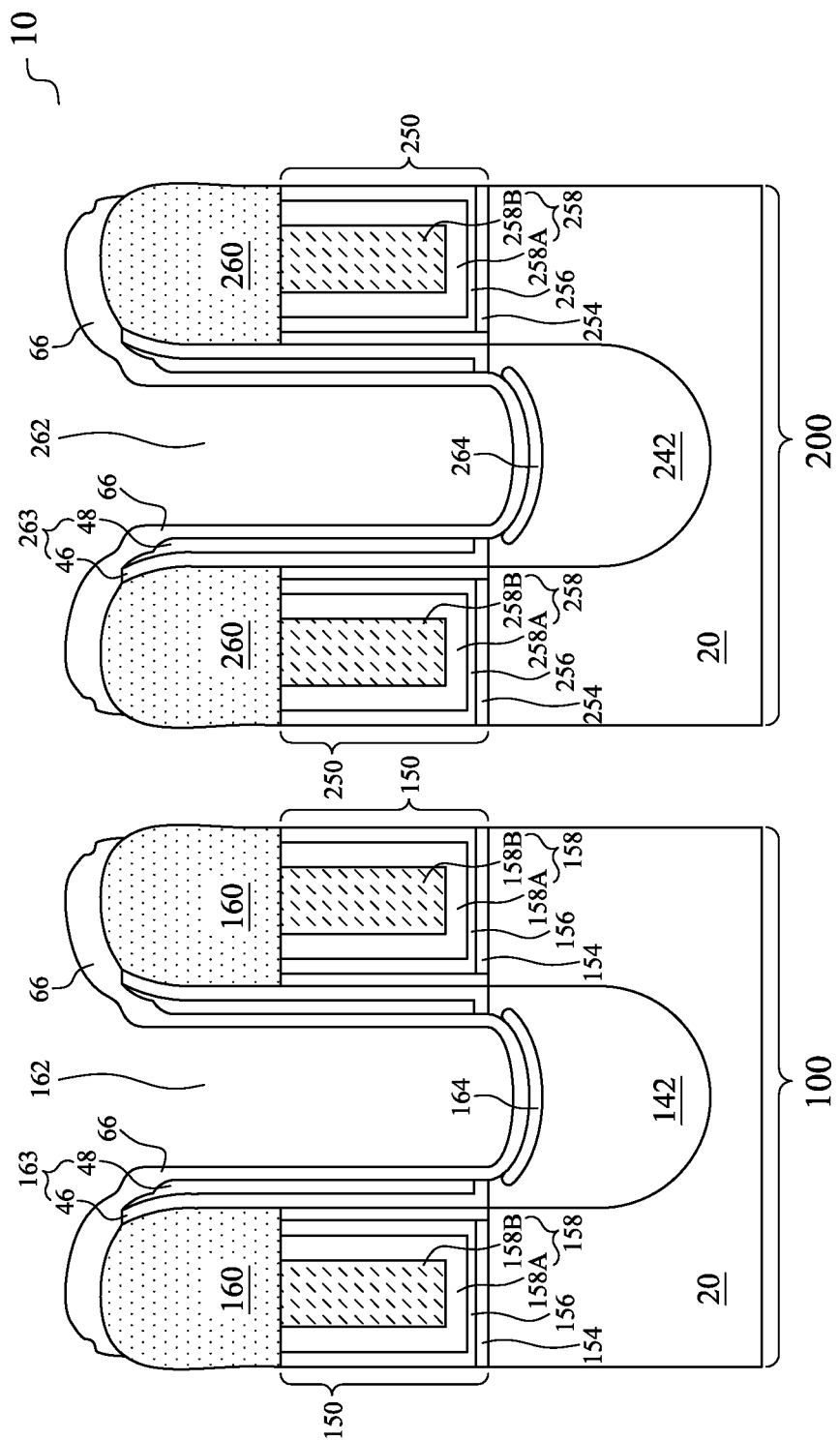

Referring to FIG. 9, dielectric spacer layer 66 is formed to extend into contact openings 162 and 262, respectively, and on the sidewalls of CESL 46 and ILD 48. The respective process is illustrated as process 316 in the process flow 300 as shown in FIG. 19. Dielectric spacer layer 66 also extends on the sidewalls of source/drain regions 142 and 242, as can be realized from the shape of source/drain regions 142 and 242 as shown in FIG. 8A. In accordance with some embodiments of the present disclosure, dielectric spacer layer 66 is formed using a conformal deposition process such as CVD or ALD. Dielectric spacer layer 66 may be a high-k dielectric layer with a k value greater than 3.9, so that it has good isolation ability. The candidate materials include SiN, SiOCN, $Al_xO_y$, $HfO_2$, or the like. The thickness of dielectric spacer layer 66 may be in the range between about 2 nm and about 6 nm, for example.

Figure 10:
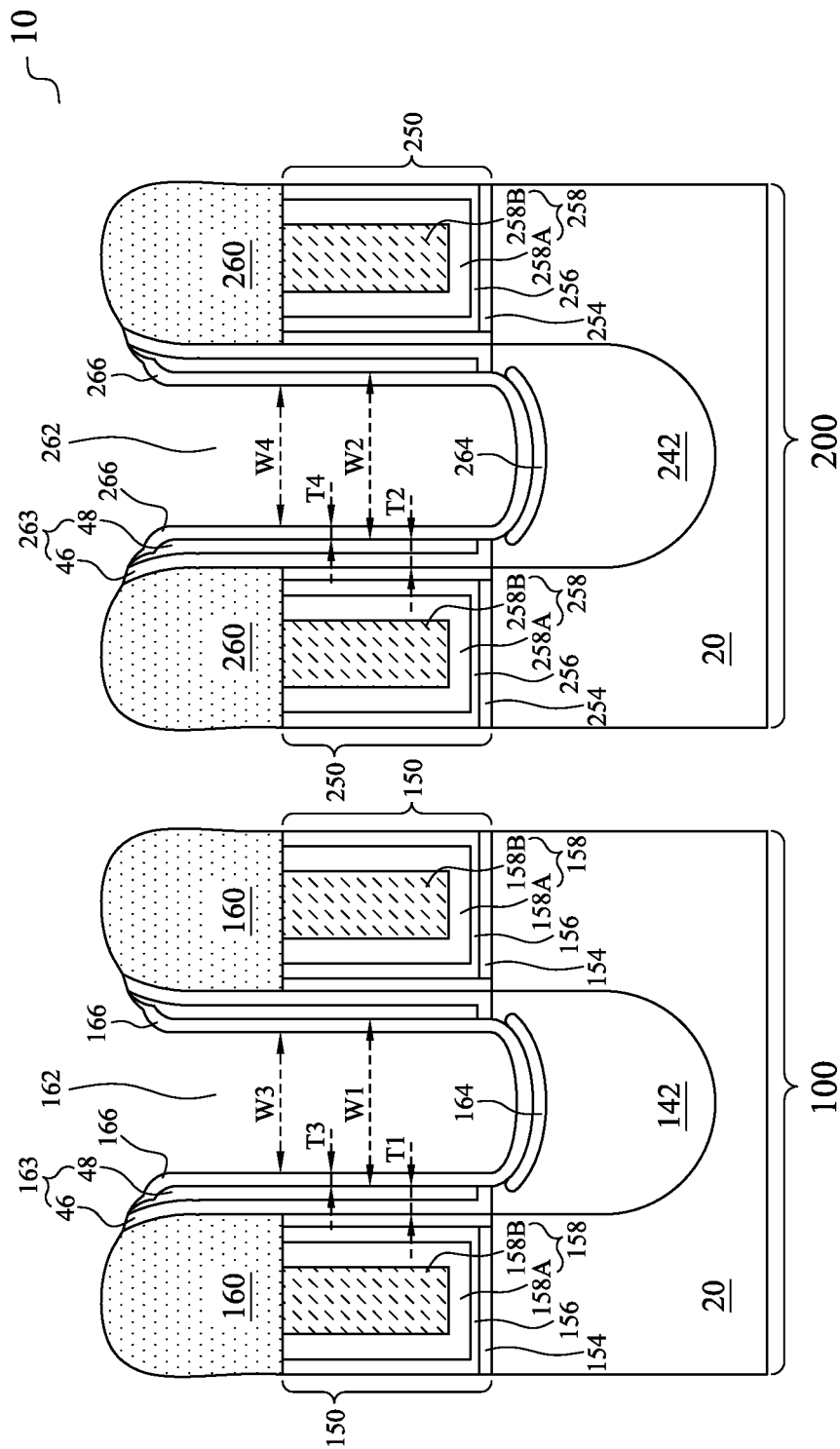

Referring to FIG. 10, an anisotropic etching process is performed, so that the horizontal portions of dielectric spacer layer 66 are removed, and the vertical portions of dielectric spacer layer 66 inside contact openings 162 and 262 are left to form contact spacers 166 and 266, respectively. The respective process is illustrated as process 318 in the process flow 300 as shown in FIG. 19. Each of contact spacers 166 and 266 may form a ring when viewed from the top of wafer 10. Since the portions of dielectric layer 66 in contact openings 162 and 262 have the same thicknesses, and further because widths W1 and W2 (the widths of contact openings 162 and 262 excluding contact spacers 166 and 266) are equal to each other, widths W3 of contact opening 162 may be equal to the width W4 of contact opening 262. The widths W3 and W4 may be measured at the middle heights of gate stacks 150 and 250, respectively.

Figure 11:
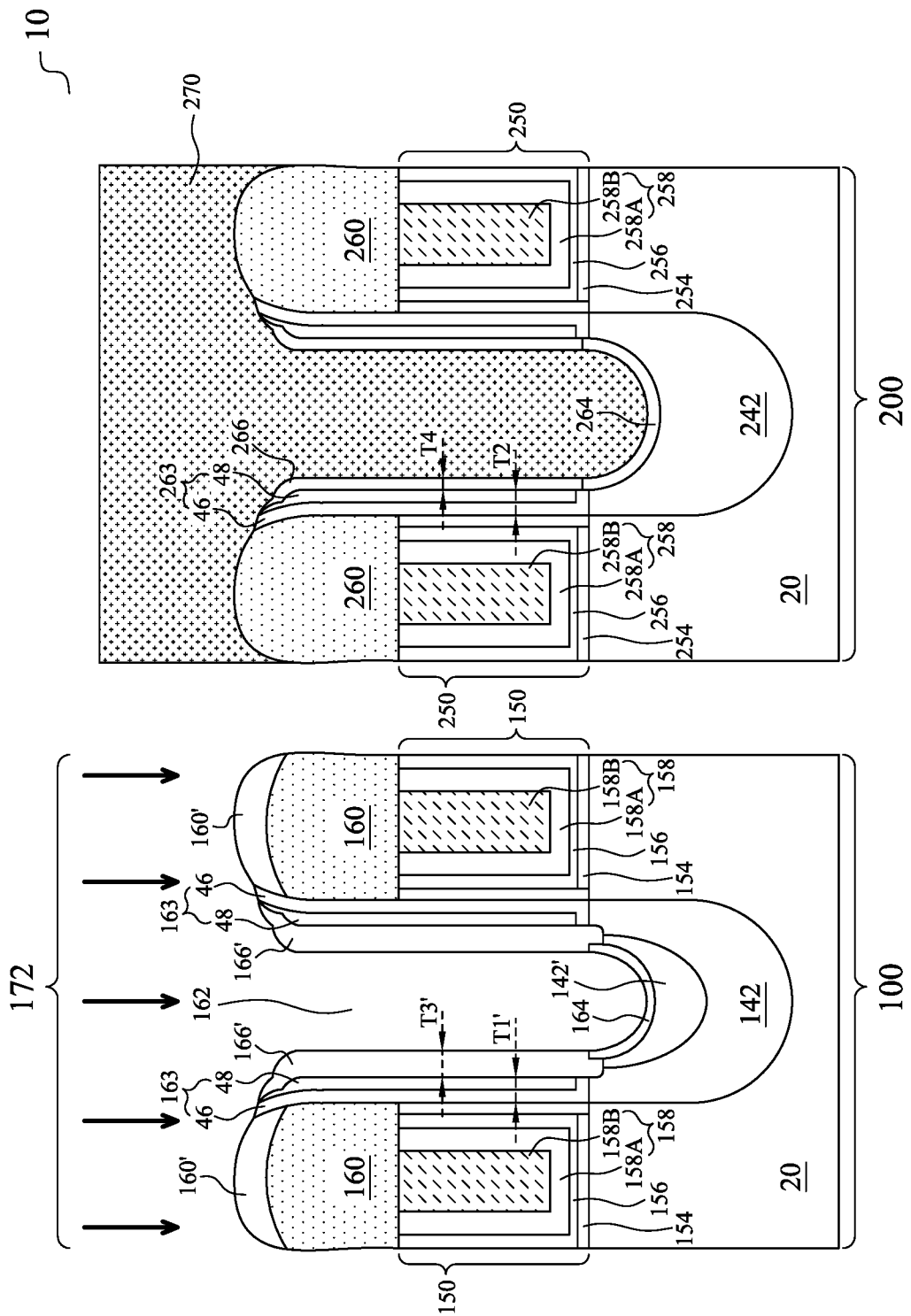

Referring to FIG. 11, implantation mask 270 is formed. Implantation mask 270 may include a photoresist, and may be single layer mask, a tri-layer mask, a quadri-layer mask, or the like. The respective process is illustrated as process 320 in the process flow 300 as shown in FIG. 19. Implantation mask 270 is patterned, with a remaining portion covering the structure in device region 200, while leaving the structure in device region FIG. 100 exposed.

Next, an implantation process 172 is performed to implant a dopant into device region 100. The respective process is illustrated as process 322 in the process flow 300 as shown in FIG. 19. The dopant is of the same conductivity type as the conductivity type of the transistor being formed in device region 100. For example, when a p-type transistor is to be formed in device region 100 (and source/drain regions 142 are of p-type), the implanted dopant is also of p-type, and may include boron, $BF_2$, gallium, indium, or the like, or combinations thereof. When an n-type transistor is to be formed in device region 100 (and source/drain regions 142 are of n-type), the implanted dopant may include arsenic, phosphorous, antimony, or combinations thereof. By selectively masking device region 200, and implanting into source/drain regions 142, the devices in device regions 100 and 200 may be handled differently. For example, when a p-type transistor and an n-type transistor are to be formed in device regions 100 and 200, respectively, the p-type dopant may be implanted to increase the p-type dopant concentration in source/drain region 142 (so that source/drain resistance may be reduced), while leaving the n-type dopant concentration in source/drain regions 242 unchanged. When the devices in device regions 100 and 200 are of a same conductivity type such as p-type or n-type, the selective implantation may also be used to fine-tune the device performance of the transistors in device regions 100 and 200, so that the transistors may have distinguished performance.

The implantation energy of implantation process 172 may be in the range between about 0.3 keV and about 50 keV. The implantation process 172 results in the top portion of source/drain region 142 to be implanted to include the dopant therein, while the lower portion of source/drain region 142 is not implanted. The implantation dosage may be in the range between about $5E13/cm^2$ and about $1E16/cm^2$. The implantation may be vertical or tilted, and the tilt angle may be smaller than about 60 degrees. During the implantation, the wafer temperature may be elevated, for example, in the range between about 100° C. and about 500° C.

FIG. 11 schematically illustrates the implanted regions, which are denoted using the corresponding notation of the implanted regions followed by sign "'". For example, the implanted top portion of source/drain 142, contact spacers 166, and gate masks 160 may alternatively denoted as 142', 166', and 160', respectively. Spacers 163 may also be implanted. Due to the implantation, the implanted portions expand in volume due to the implantation damage, and due to the adding of the implanted dopant. The thicknesses of spacers 163 and 166 are denoted as T1' and T3', respectively, with thickness T1' being greater than thickness T1 (FIG. 10), and thickness T3' being greater than thickness T3 (FIG. 10). Thicknesses T1 and T3 are the thicknesses of spacers 163 and 166, respectively, before the implantation process is performed. Furthermore, thickness T1' may be greater than thickness T2 of spacers 263, and thickness T3' may be greater than thickness T4 of spacers 266.

In accordance with some embodiments, the total thickness (T1'+T3') is greater than the total thickness (T1+T3) (FIG. 10, before the implantation process) by a difference in the range between about 2 Å and about 1 nm. Furthermore, spacers 263 and 266 also have a total thickness (T2+T4), which may be equal to the total thickness (T1+T3). Accordingly, the total thickness (T1'+T3') of contact spacers 163' and 166' is also greater than the total thickness (T2+T4) of contact spacers 263 and 266. The expansion of contact spacers 163' and 166' may result the adverse reduction in the width of the subsequently formed contact plugs, and results in the adverse increase in contact resistance.

Due to the masking of device region 200 during the implantation process 172, the contact spacers 266 and contact spacers 263 (and the ILD 48 and CESL 46 in contact spacers 263) may be free from the implanted dopant such as boron, gallium, indium, or the like, depending the dopant adopted in implantation process 172. Furthermore, device region 200 may not be implanted with any dopant that has the same conductivity type as source/drain regions 242. For example, when source/drain regions 242 are n-type regions, contact spacers 266 and spacers 263 in the resulting FinFET 290 (FIG. 15) may be free from phosphorous, arsenic, antimony, or the like.

Figure 12:
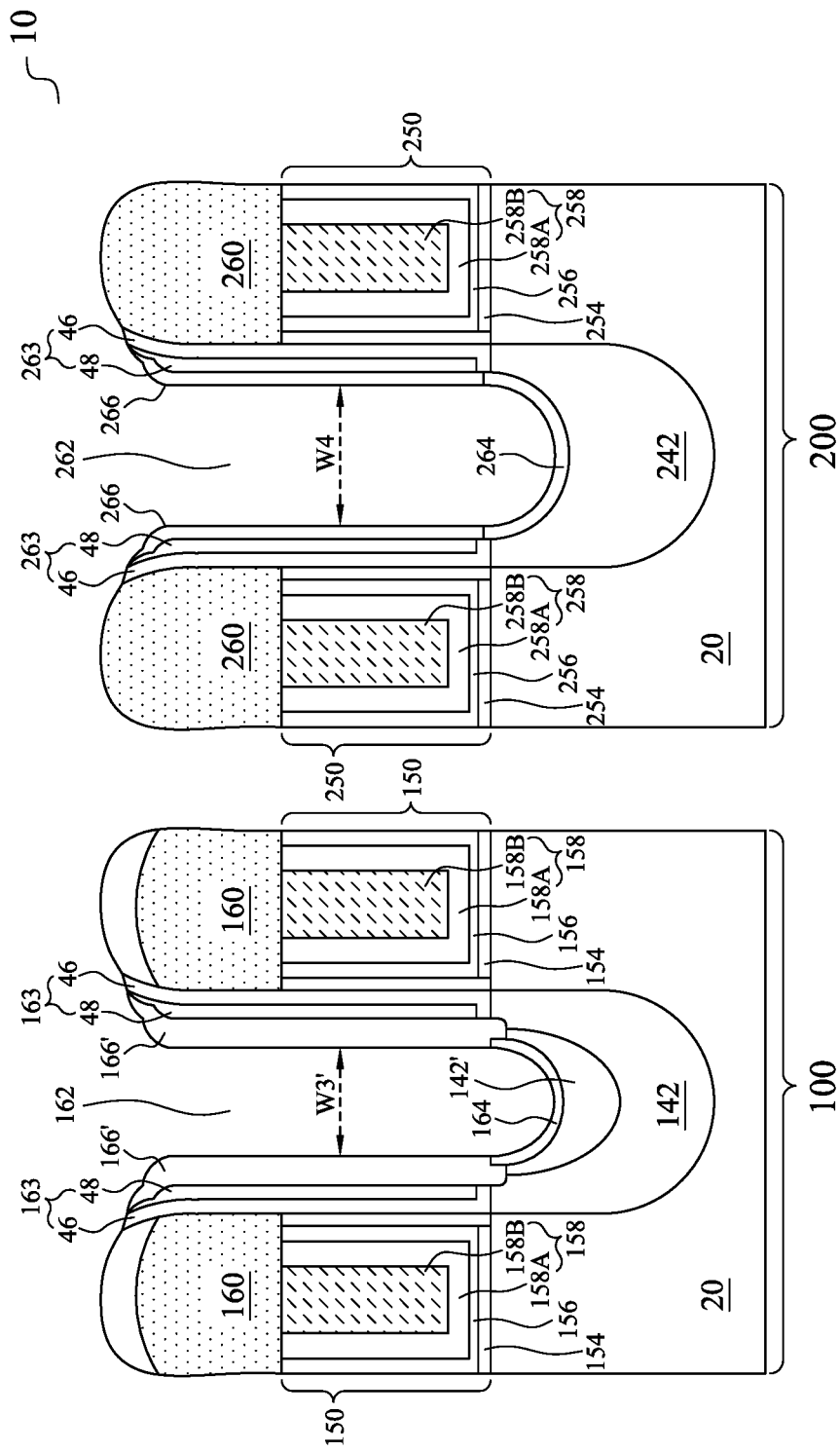

After the implantation process, implantation mask 270 is removed. The resulting structure is illustrated in FIG. 12. The respective process is illustrated as process 324 in the process flow 300 as shown in FIG. 19. Both of the oxide layers 164 and 264 are exposed. Due to the implantation, contact spacers 163 and 166' expand laterally, while contact spacers 263 and 266 do not expand, W3' of contact opening 162 is smaller than W4 of contact opening 262.

Figure 13:
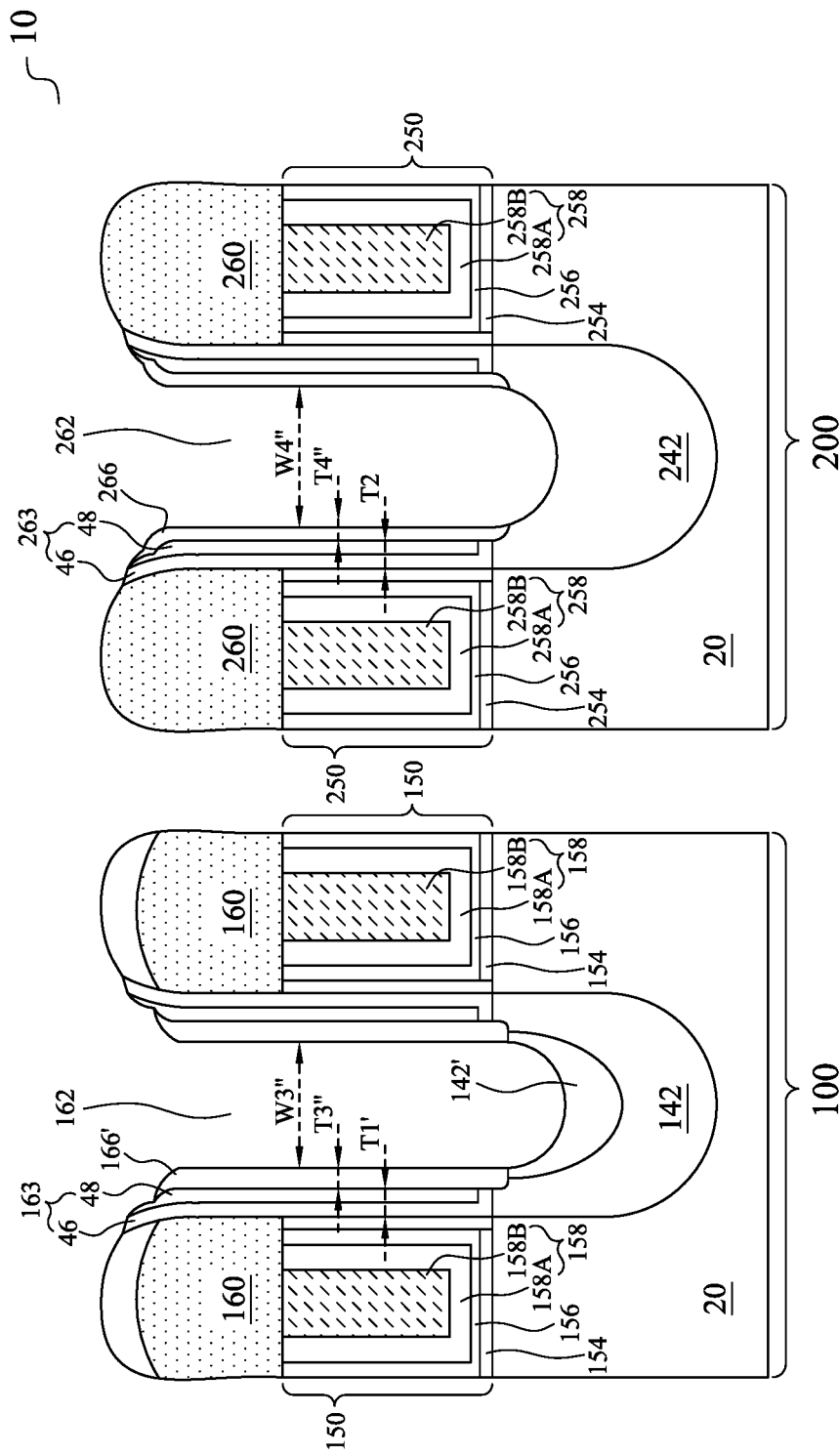

In a subsequent process, a cleaning process is performed to remove oxide layers 164 and 264, and to reveal source/drain regions 142 and 242. The respective process is illustrated as process 326 in the process flow 300 as shown in FIG. 19. The resulting structure is shown in FIG. 13. In accordance with some embodiments, the cleaning process may be performed using the mixture of $NF_3$ and $NH_3$, the mixture of HF and $NH_3$, or the like when dry cleaning is used. The cleaning process may also be performed using diluted HF solution when wet cleaning is used. During the cleaning process, both of contact spacers 166' and 266 are exposed to the cleaning chemical and are also thinned, although contact spacers 166' and 266 are thinned at a lower etching rate than the corresponding oxide layers 164 and 264. The resulting thicknesses of contact spacers 166' and 266 are referred to as thicknesses T3" and T4", respectively, which are smaller than thicknesses T3' and T4, respectively, in FIG. 11. In accordance with some embodiments, the thicknesses of spacers 166' and 266 may be reduced by values in the range between about 0.5 nm and about 2 nm.

The implanted contact spacers 166' have a greater etching rate than contact spacer 266. Accordingly, the increased thickness of contact spacers 166' (due to implantation) is compensated for (reduced more) due to the increased etching rate of contact spacers 166' than contact spacers 266. By performing the implantation process after, rather than before, the formation of contact spacers 166' (166), the effect of the implantation to the thickness of contact spacers 166' is at least reduced, or substantially eliminated. For example, thickness T3" is smaller than thickness T3' (FIG. 11), and may be equal to, smaller than, or greater than, thickness T3 (FIG. 10).

Furthermore, by performing the implantation process after the formation of contact spacers 166 (166'), the thickness difference ((T1'+T3")−(T2+T4")) is reduced, and may be eliminated, wherein (T1'+T3") is the total thickness of contact spacers 163 and 166', and (T2+T4") is the total thickness of contact spacers 263 and 266. For example, the thickness difference may be smaller than about 0.5 nm, and may be smaller than about 0.2 nm. Furthermore, in FIG. 13, W3" of contact opening 162 may be equal to, smaller than, or greater than W4" of contact opening 262. Alternatively stated, due to the implantation, the width of opening 162 is reduced by a first amount, and the cleaning and the thinning process result in the increase in the width of opening 162 by a second amount. The second amount may be equal to, greater than, or smaller than the first amount. In accordance with some embodiments, the cleaning process (such as the chemical and/or the time duration) is adjusted, so that width W3" is equal to width W4", and the width of the resulting contact plug is maximized, while the protection provided by contact spacer 166 is not sacrificed. Also, thickness T1' may be greater than thickness T2, and thickness T3" will be smaller than thickness T4".

Figure 14:
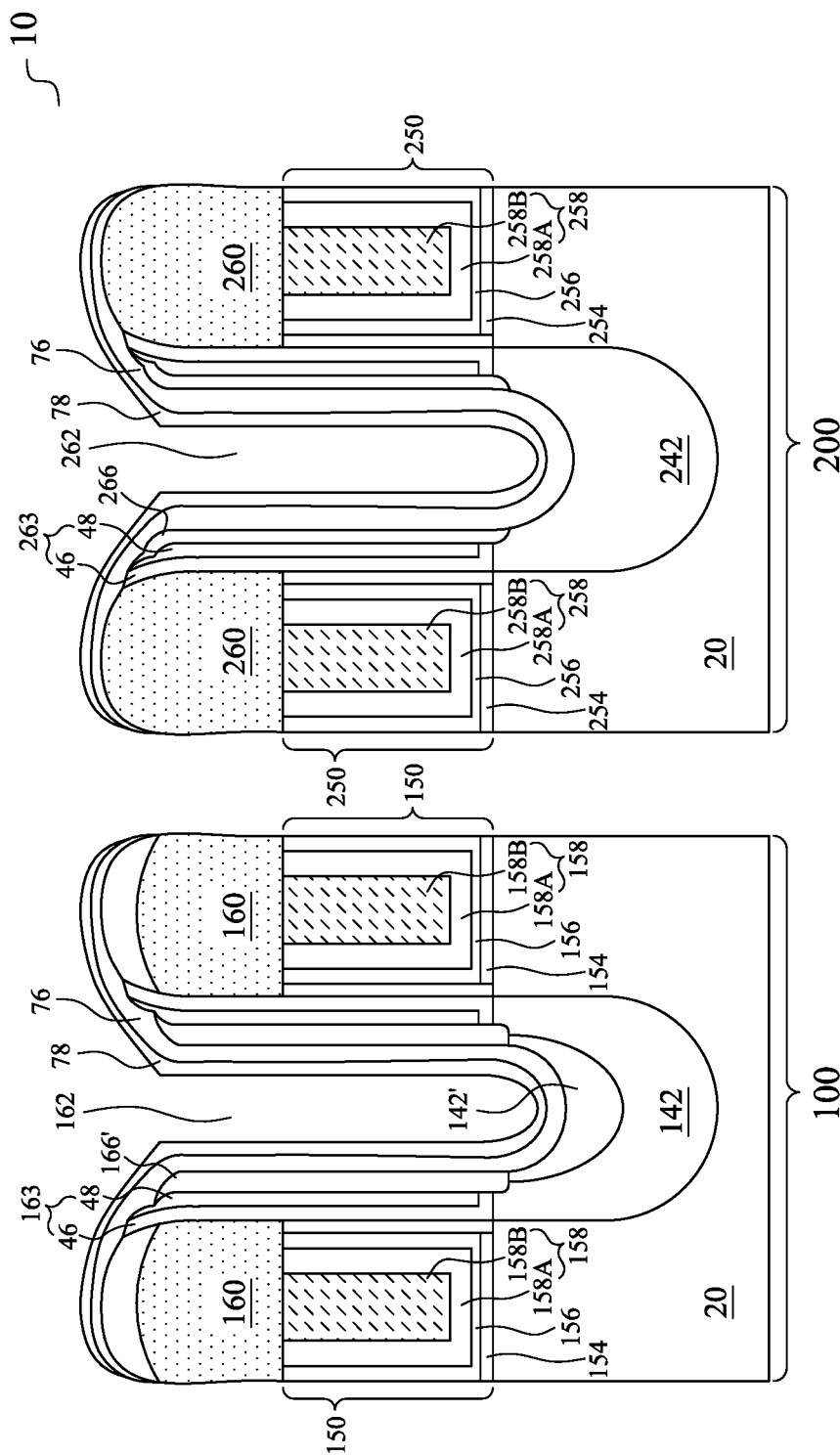
Figure 15:
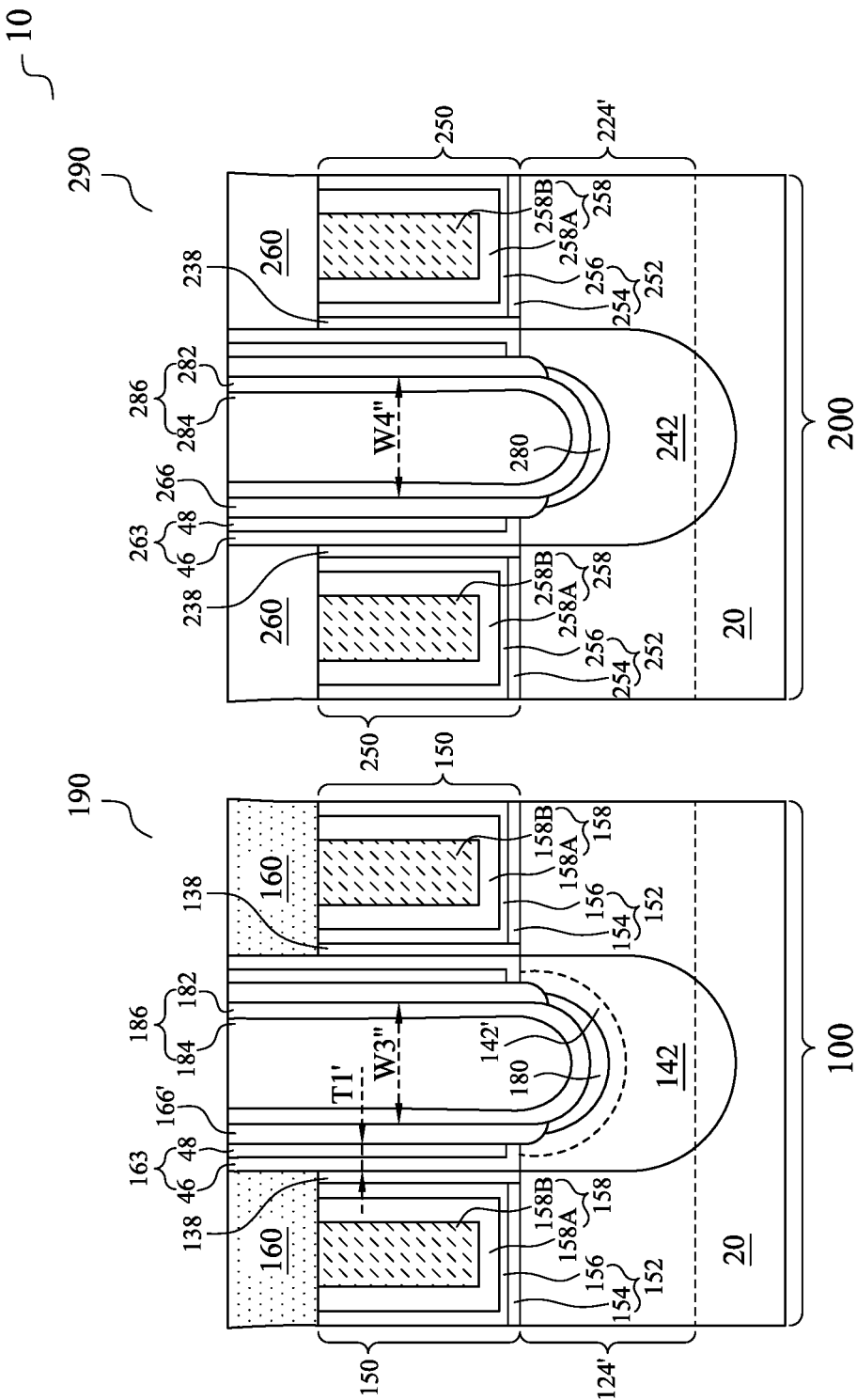

FIGS. 14 and 15 illustrate the formation of source/drain silicide regions. Referring to FIG. 14, metal layer 76 (such as a titanium layer or a cobalt layer) is deposited, for example, using Physical Vapor Deposition (PVD). Barrier layer 78, which may be a metal nitride layer such as a titanium nitride layer or a tantalum nitride layer, is then deposited over metal layer 76. The respective process is illustrated as process 328 in the process flow 300 as shown in FIG. 19. Barrier layer 78 may be formed by nitriding a top layer of metal layer 76, and leaving the bottom layer of metal layer 76 not nitridized. Alternatively, barrier layer 78 may be formed through a deposition process such as a CVD process or an ALD process. Metal layer 76 and barrier layer 78 may both be conformal, and extend into contact openings 162 and 262.

An annealing process is then performed to react metal layer 76 with the silicon (and germanium, if any) in source/drain regions 142 and 242. Source/drain silicide regions 180 and 280 are thus formed, as shown in FIG. 15. The respective process is illustrated as process 330 in the process flow 300 as shown in FIG. 19. The annealing process may be performed through Rapid Thermal Anneal (RTA), furnace anneal, or the like. Some sidewall portions of metal layer 76 remain after the silicidation process.

In accordance with some embodiments, barrier layer 78 and the remaining metal layer 76 are removed, followed by the formation of additional barrier layers 182 and 282 as shown in FIG. 15. In accordance with some embodiments, barrier layers 182 and 282 are also formed of titanium nitride, tantalum nitride, or the like. Next, a metallic material is deposited over and in contact with barrier layers 182 and 282. The metallic material may include tungsten, cobalt, or the like. A planarization process such as a CMP process or a mechanical grinding process is then performed to remove excess portions of barrier layers 182 and 282 and the metallic material. The remaining portions of the metallic material are referred to as metal regions 184 and 284. Diffusion barrier 182 and metal region 184 collectively form source/drain contact plug 186, and diffusion barrier 282 and metal region 284 collectively form source/drain contact plug 286. The respective process is illustrated as process 332 in the process flow 300 as shown in FIG. 19. FinFETs 190 and 290 are thus formed.

In accordance with alternative embodiments, instead of removing barrier layer 78 and the remaining metal layers 76, barrier layer 78 may be pulled back through etching, so that its top surface is lower than the top surface of ILD 48, and hence the opening has wider top portions for easier gap filling. The additional barrier layers 182 and 282 are formed on the pulled-back barrier layer 78 (not shown) and the remaining portions of metal layer 76. The metal regions 184 and 284 are further formed on the additional barrier layers 182 and 282.

Figure 16:
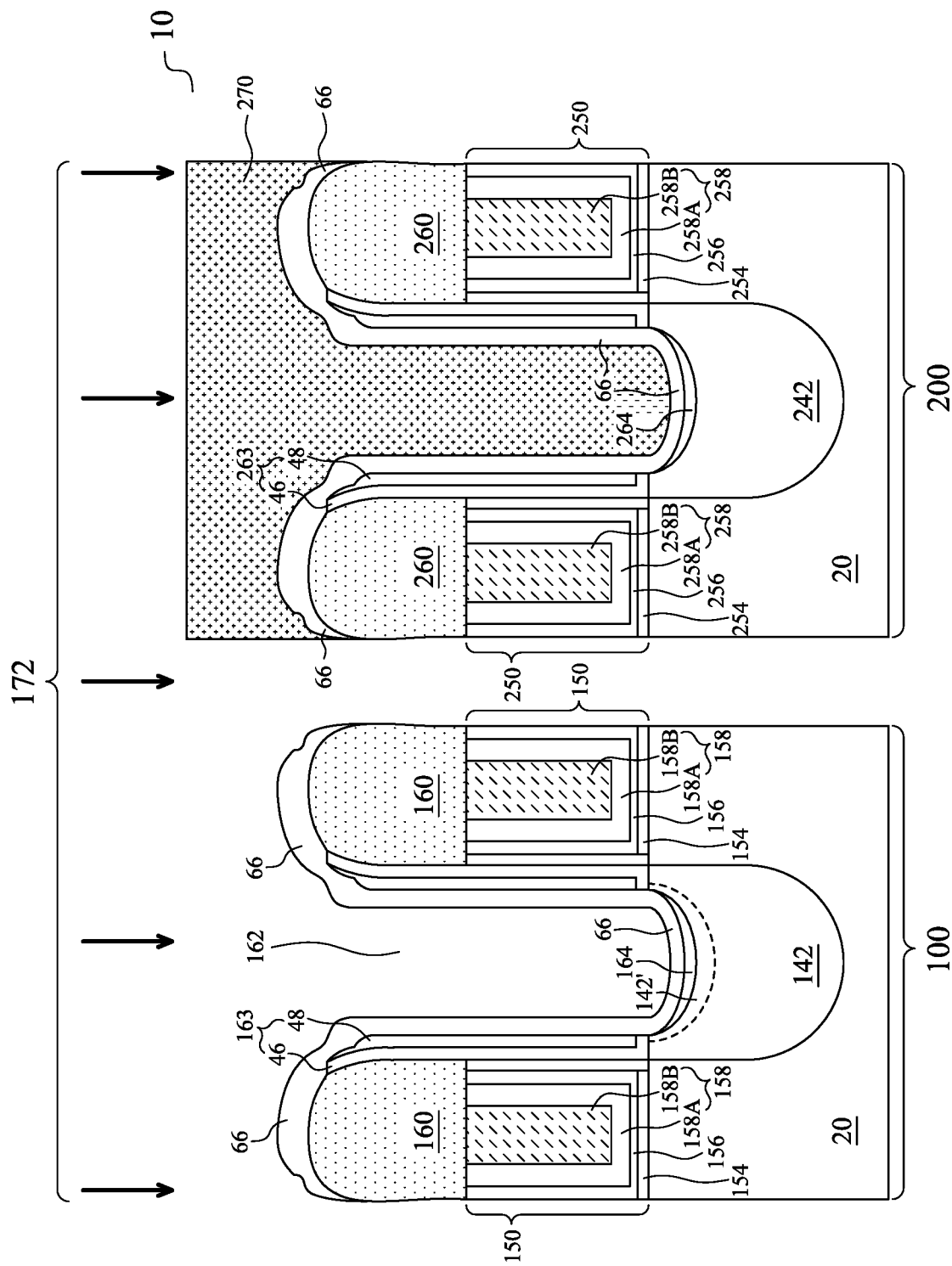
FIGS. 16 and 17 illustrate the cross-sectional views of intermediate stages in the formation of FinFETs and contact plugs in accordance with some embodiments.
Figure 17:
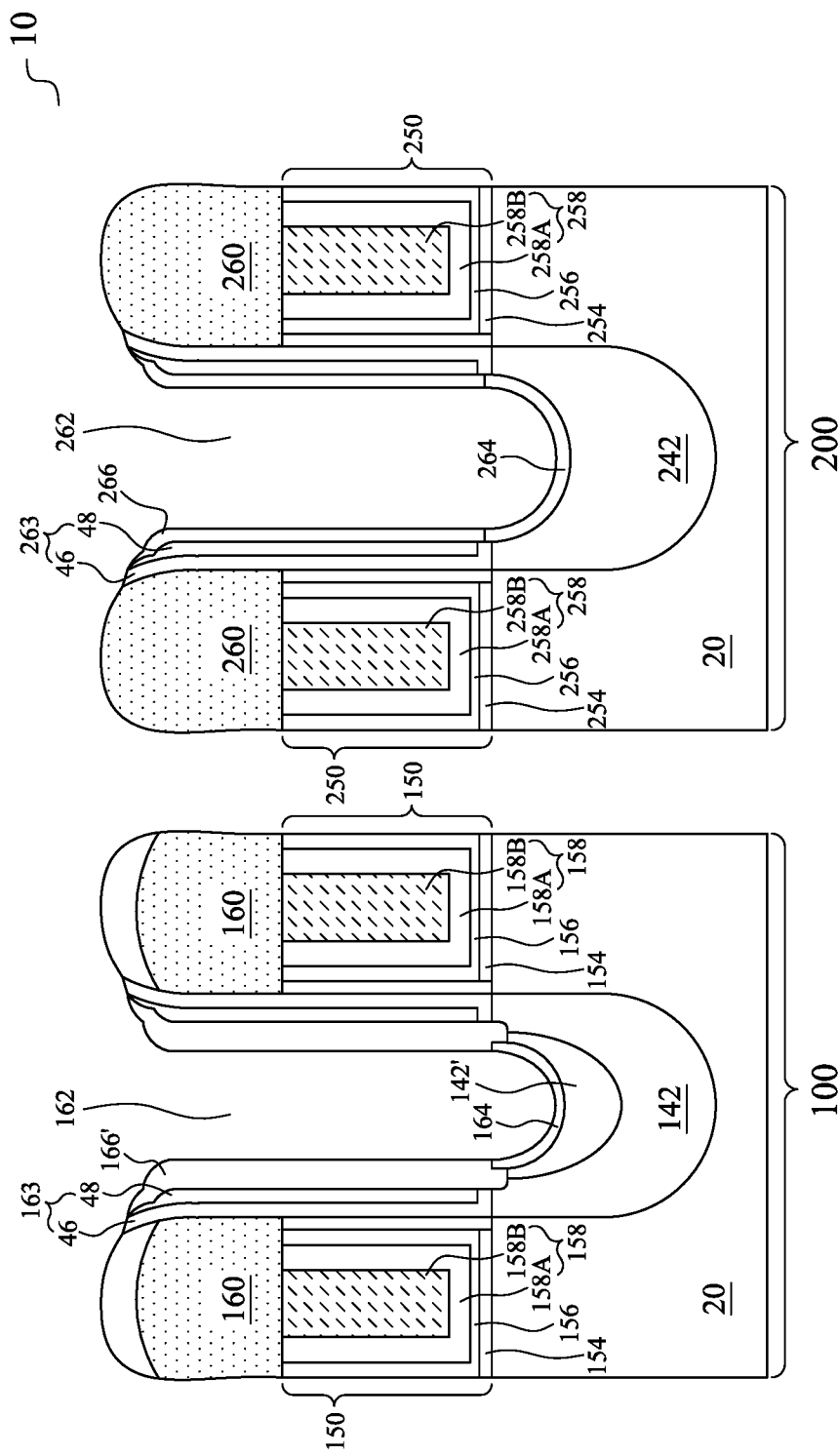

FIGS. 16 and 17 illustrate the cross-sectional views of intermediate stages in the formation of FinFETs and the corresponding contact plugs in accordance with alternative embodiments of the present disclosure. These embodiments are similar to the preceding embodiments, except that the implantation is performed before, not after, the anisotropic etching of the spacer layer for forming contact spacers. Unless specified otherwise, the materials and the formation processes of the components in these embodiments are essentially the same as the like components, which are denoted by like reference numerals in the preceding embodiments shown in preceding figures. The details regarding the formation process and the materials of the components shown in FIGS. 16 and 17 may thus be found in the discussion of the preceding embodiments.

The initial processes of these embodiments are the same as shown in FIGS. 1-6, 7A, 7B, 8A, 8B, and 9. Next, instead of etching spacer layer 66 to form contact spacers, the processes proceed to the process shown in FIG. 16. Implantation mask 270 is formed, and implantation process 172 is performed to dope dopants into device region 100. During the implantation, the unremoved horizontal portions of spacer layer 66 may help to reduce the implantation damage to the underlying source/drain region 142. After the implantation process 172, Implantation mask 270 is removed, followed by the anisotropic etching of spacer layer 66, so that contact spacers 166' and 266 are formed. The resulting structure is shown in FIG. 17. The subsequent processes are essentially the same as shown in FIG. 13 through 15, and are not repeated herein. The resulting FinFETs 190 and 290 are also essentially the same as shown in FIG. 15.

Figure 18:
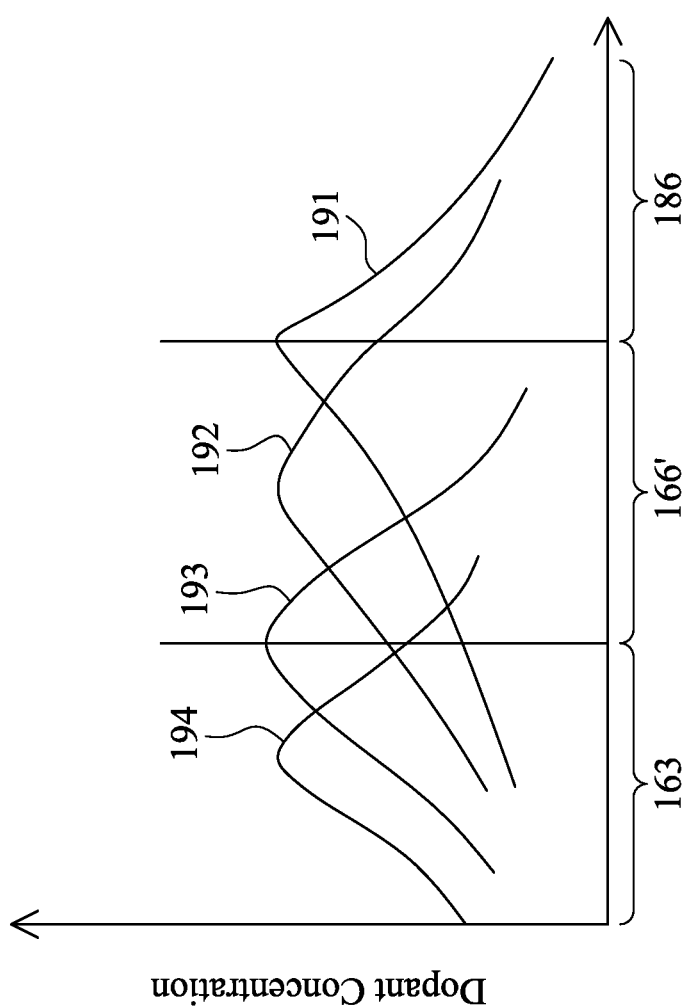
FIG. 18 illustrate the distribution of an implanted dopant in a FinFET in accordance with some embodiments.

FIG. 18 schematically illustrates the distribution of the implanted dopant in spacer 163, contact spacer 166', and contact plug 186 in accordance with some embodiments. The distribution is obtained at the middle height of gate stack 150. Line 191 represents one likely distribution. Due to the etching of spacer 166' in the cleaning process as shown in FIG. 13, the peak concentration of the dopant, which is introduced in the process shown in FIG. 11, may be at the exposed sidewall after the cleaning process. As a result, due to the subsequent diffusion, the peak concentration of the dopant in the final structure (FIG. 15) may be at the interface between contact spacer 166' and contact plug 186. When tilt implant is performed, and the dopant is implanted deeper into contact spacer 166' and spacer 163, the peak concentration of the dopant may be at the positions as shown by lines 192, 193, or 194.

The embodiments of the present disclosure have some advantageous features. By adopting the embodiments of the present disclosure, the dopant loss from the source/drain regions due to the various processes for forming contact plugs is reduced as compared to conventional processes. In conventional processes, the implantation of the dopant is performed after the formation of the contact opening, and before the deposition and the anisotropic etching of the spacer layer for forming contact spacers. Accordingly, since the anisotropic etching of the spacer layer results in dopant loss in the already implanted dopant, the dopant loss is severe. In the embodiments of the present disclosure, since the implantation is performed after the anisotropic etching, there is no dopant loss caused by the anisotropic etching. The dopant loss in the embodiments of the present disclosure is thus lower than in conventional processes. For example, multiple experimental samples have revealed that the final dopant concentration in the source/drain regions of the samples formed according to the embodiments of the present disclosure is about 6 percent higher than in the source/drain regions of the samples formed using conventional processes.

Furthermore, since the implanted contact spacers have higher etching rate during the cleaning processes than the un-implanted contact spacers, the expansion of the contact spacers caused by the implantation process is compensated for, and the thickness of the expanded contact spacers may be reduced more than if they are not implanted. The widths (critical dimension) of the resulting contact plugs 186 may thus be brought back to the same values as the contact plugs (such as contact plugs 286), and the within-wafer uniformity of the width of the contact plugs is improved. For example, some sample wafers are formed adopting the embodiments of the present disclosure. The average difference between the widths of contact plugs 186 and 286 is smaller than about 0.2 nm (or smaller than about 0.1 nm), and is smaller than about 2 percent or 1 percent of the average widths. As a comparison, if conventional processes are used, the average width of contact plugs 186 is smaller than the average width of contact plug 286, with the average difference being about 1 nm, and may be as high as about 7 percent of the average widths.

In accordance with some embodiments of the present disclosure, a method comprises forming a first source/drain region; forming a dielectric layer over the first source/drain region; etching the dielectric layer to form a first contact opening, wherein the first source/drain region is exposed to the first contact opening; depositing a dielectric spacer layer extending into the first contact opening; etching the dielectric spacer layer to form a first contact spacer in the first contact opening; after the dielectric spacer layer is deposited, implanting a dopant into the first source/drain region through the first contact opening; and forming a first contact plug to fill the first contact opening.

In an embodiment, the dopant is implanted on the first contact spacer. In an embodiment, the dopant penetrates through a bottom portion of the dielectric spacer layer to reach the first source/drain region. In an embodiment, the forming the first source/drain region comprises in-situ doping a p-type dopant, and wherein the dopant introduced by the implanting is also of p-type. In an embodiment, the implanting the dopant results in a width of the first contact opening to be reduced by a first amount, and the method comprises, at a time after the implanting the dopant into the first source/drain region and before the forming the first contact plug to fill the first contact opening, performing a cleaning process to remove an oxide layer on the first source/drain region, wherein in the cleaning process, the width of the first contact opening is increased by a second amount equal to or greater than the first amount.

In an embodiment, the second amount is greater than the first amount. In an embodiment, the etching the dielectric layer comprises etching an inter-layer dielectric and etching a contact etch stop layer underlying the inter-layer dielectric. In an embodiment, after the etching the dielectric layer to form the first contact opening, a portion of the dielectric layer is left on opposing sides of the first contact opening to form additional spacers. In an embodiment, the method further comprises forming a second source/drain region; etching the dielectric layer to form a second contact opening, wherein the second source/drain region is exposed to the second contact opening; etching the dielectric spacer layer to form a second contact spacer in the second contact opening, wherein when the dopant is implanted, the second contact spacer is masked from the implanting; and forming a second contact plug to fill the second contact opening. In an embodiment, first source/drain region is of p-type, and the second source/drain region is of n-type.

In accordance with some embodiments of the present disclosure, a method comprises etching an inter-layer dielectric and a contact etch stop layer underlying the inter-layer dielectric to form a first contact opening and a second contact opening, wherein a first source/drain region and a second source/drain region are underlying and exposed to the first contact opening and the second contact opening, respectively; depositing a dielectric spacer layer extending into the first contact opening and the second contact opening; etching the dielectric spacer layer to form a first contact spacer in the first contact opening, and a second contact spacer in the second contact opening; forming an implantation mask over the second contact spacer and the second source/drain region; implanting a dopant into the first source/drain region through the first contact opening; and removing the implantation mask.

In an embodiment, the method further comprises, after the implantation mask is removed, performing an etching process to remove a first oxide layer on the first source/drain region, and a second oxide layer on the second source/drain region. In an embodiment, before the implanting, the first contact spacer has a first thickness, and after the implanting, the first contact spacer has a second thickness greater than the first thickness, and wherein after the etching process, the first contact spacer has third thickness equal to or smaller than the first thickness. In an embodiment, the first source/drain region and the second source/drain region are of opposite conductivity types. In an embodiment, the first source/drain region and the second source/drain region are of a same conductivity type. In an embodiment, the dopant implanted by the implanting has a same conductivity type as the first source/drain region. In an embodiment, the dopant implanted by the implanting has an opposite conductivity type than the second source/drain region.

In accordance with some embodiments of the present disclosure, a structure comprises a first semiconductor region; a first gate stack on the first semiconductor region; a first source/drain region on a side of the first gate stack, wherein the first source/drain region is of a first conductivity type; a first silicide region over the first source/drain region; a first contact plug over the first silicide region; a first contact spacer encircling and contacting the first contact plug; and a dopant of the first conductivity type in the first contact plug and the first contact spacer, wherein the dopant has a peak concentration that is either in the first contact spacer, or at an interface between the first contact spacer and the first contact plug.

In an embodiment, the peak concentration is at the interface. In an embodiment, the structure further comprises a second semiconductor region; a second gate stack on the second semiconductor region; a second source/drain region on a side of the second gate stack, wherein the second source/drain region is of a second conductivity type opposite to the first conductivity type; a second silicide region over the second source/drain region; a second contact plug over the second silicide region, wherein the first contact plug and the second contact plug have substantially a same width; and a second contact spacer encircling and contacting the second contact plug, wherein the first contact spacer and the second contact spacer are formed of a same dielectric material, and wherein the second contact spacer is thinner than the first contact spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first source/drain region;
    forming a dielectric layer over the first source/drain region;
    etching the dielectric layer to form a first contact opening, wherein the first source/drain region is exposed to the first contact opening;
    depositing a dielectric spacer layer extending into the first contact opening;
    etching the dielectric spacer layer to form a first contact spacer in the first contact opening;
    after the dielectric spacer layer is deposited, implanting a dopant into the first source/drain region through the first contact opening; and
    forming a first contact plug to fill the first contact opening.

2. The method of claim 1, wherein the dopant is implanted on the first contact spacer.

3. The method of claim 1, wherein the dopant penetrates through a bottom portion of the dielectric spacer layer to reach the first source/drain region.

4. The method of claim 1, wherein the forming the first source/drain region comprises in-situ doping a p-type dopant, and wherein the dopant introduced by the implanting is also of p-type.

5. The method of claim 1, wherein the implanting the dopant results in a width of the first contact opening to be reduced by a first amount, and the method comprising:
    at a time after the implanting the dopant into the first source/drain region and before the forming the first contact plug to fill the first contact opening, performing a cleaning process to remove an oxide layer on the first source/drain region, wherein the cleaning process results in the width of the first contact opening to be increased by a second amount equal to or greater than the first amount.

6. The method of claim 5, wherein the second amount is greater than the first amount.

7. The method of claim 1, wherein the etching the dielectric layer comprises etching an inter-layer dielectric and etching a contact etch stop layer underlying the inter-layer dielectric.

8. The method of claim 1, wherein after the etching the dielectric layer to form the first contact opening, a portion of the dielectric layer is left on opposing sides of the first contact opening to form additional spacers.

9. The method of claim 1 further comprising:
forming a second source/drain region;
etching the dielectric layer to form a second contact opening, wherein the second source/drain region is exposed to the second contact opening;
etching the dielectric spacer layer to form a second contact spacer in the second contact opening, wherein when the dopant is implanted, the second contact spacer is masked from the implanting; and
forming a second contact plug to fill the second contact opening.

10. The method of claim 9, wherein the first source/drain region is of p-type, and the second source/drain region is of n-type.

11. A method comprising:
etching an inter-layer dielectric and a contact etch stop layer underlying the inter-layer dielectric to form a first contact opening and a second contact opening, wherein a first source/drain region and a second source/drain region are underlying and exposed to the first contact opening and the second contact opening, respectively;
depositing a dielectric spacer layer extending into the first contact opening and the second contact opening;
etching the dielectric spacer layer to form a first contact spacer in the first contact opening, and a second contact spacer in the second contact opening;
forming an implantation mask over the second contact spacer and the second source/drain region;
implanting a dopant into the first source/drain region through the first contact opening; and
removing the implantation mask.

12. The method of claim 11 further comprising, after the implantation mask is removed, performing an etching process to remove a first oxide layer on the first source/drain region, and a second oxide layer on the second source/drain region.

13. The method of claim 12, wherein before the implanting, the first contact spacer has a first thickness, and after the implanting, the first contact spacer has a second thickness greater than the first thickness, and wherein after the etching process, the first contact spacer has third thickness equal to or smaller than the first thickness.

14. The method of claim 11, wherein the first source/drain region and the second source/drain region are of opposite conductivity types.

15. The method of claim 11, wherein the first source/drain region and the second source/drain region are of a same conductivity type.

16. The method of claim 11, wherein the dopant implanted by the implanting has a same conductivity type as the first source/drain region.

17. The method of claim 16, wherein the dopant implanted by the implanting has an opposite conductivity type than the second source/drain region.

18. A structure comprising:
a first semiconductor region;
a first gate stack on the first semiconductor region;
a first source/drain region on a side of the first gate stack, wherein the first source/drain region is of a first conductivity type;
a first silicide region over the first source/drain region;
a first contact plug over the first silicide region;
a first contact spacer encircling and contacting the first contact plug; and
a dopant of the first conductivity type in the first contact plug and the first contact spacer, wherein the dopant has a peak concentration that is either in the first contact spacer, or at an interface between the first contact spacer and the first contact plug.

19. The structure of claim 18, wherein the peak concentration is at the interface.

20. The structure of claim 18 further comprising:
a second semiconductor region;
a second gate stack on the second semiconductor region;
a second source/drain region on a side of the second gate stack, wherein the second source/drain region is of a second conductivity type opposite to the first conductivity type;
a second silicide region over the second source/drain region;
a second contact plug over the second silicide region, wherein the first contact plug and the second contact plug have substantially a same width; and
a second contact spacer encircling and contacting the second contact plug, wherein the first contact spacer and the second contact spacer are formed of a same dielectric material, and wherein the second contact spacer is thinner than the first contact spacer.

* * * * *